United States Patent
Wilcox et al.

(10) Patent No.: US 9,082,921 B2
(45) Date of Patent: Jul. 14, 2015

(54) MULTI-DIE LED PACKAGE

(75) Inventors: Kurt S. Wilcox, Libertyville, IL (US); Bernd P. Keller, Santa Barbara, CA (US); Theodore Lowes, Lompoc, CA (US); Peter Scott Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 256 days.

(21) Appl. No.: 13/441,620

(22) Filed: Apr. 6, 2012

(65) Prior Publication Data

US 2013/0092960 A1    Apr. 18, 2013

Related U.S. Application Data

(63) Continuation-in-part of application No. 11/982,275, filed on Oct. 31, 2007, and a continuation-in-part of application No. 13/017,502, filed on Jan. 31, 2011.

(60) Provisional application No. 61/384,625, filed on Sep. 20, 2010, provisional application No. 61/390,963, filed on Oct. 7, 2010.

(51) Int. Cl.
*H01L 33/00* (2010.01)
*H01L 33/08* (2010.01)
(Continued)

(52) U.S. Cl.
CPC ............ *H01L 33/08* (2013.01); *H01L 25/0753* (2013.01); *H01L 31/12* (2013.01); *H01L 33/48* (2013.01); *H01L 33/486* (2013.01); *H01L 33/62* (2013.01); *H01L 33/64* (2013.01); *H01L 33/405* (2013.01); *H01L 33/54* (2013.01); *H01L 33/647* (2013.01); *H01L 2224/32225* (2013.01); *H01L 2224/48091* (2013.01); *H01L 2224/48137* (2013.01); *H01L 2224/48227* (2013.01);
(Continued)

(58) Field of Classification Search
CPC ........ H01L 33/48; H01L 33/486; H01L 31/12
USPC .......................................................... 257/99
See application file for complete search history.

(56) References Cited

U.S. PATENT DOCUMENTS 4,946,547 A    8/1990   Palmour
5,200,022 A    4/1993   Kong
(Continued)

FOREIGN PATENT DOCUMENTS

CN    ZL201230476421.3    5/2014
EP    002114934-0001    10/2012
(Continued)

OTHER PUBLICATIONS

Chinese Office Action for Application No. 201230476421.3 dated Jul. 18, 2013.
(Continued)

*Primary Examiner* — David Zarneke
(74) *Attorney, Agent, or Firm* — Jenkins, Wilson, Taylor & Hunt, P.A.

(57) ABSTRACT

A light-emitting device comprising (a) a submount having front and back sides and including a ceramic layer; (b) an array of light-emitting diodes (LEDs) on the front side; and (c) a lens overmolded on the submount and covering the LED array. In some embodiments, the submount comprises at least two electrically-conductive contact pads on the front side, and each LED in the array is secured with respect to one of the contact pads.

64 Claims, 29 Drawing Sheets

(51) Int. Cl.
*H01L 33/48* (2010.01)
*H01L 31/12* (2006.01)
*H01L 33/62* (2010.01)
*H01L 33/64* (2010.01)
*H01L 25/075* (2006.01)
*H01L 33/54* (2010.01)
*H01L 33/40* (2010.01)

(52) U.S. Cl.
CPC ............ *H01L2224/49113* (2013.01); *H01L 2224/73265* (2013.01); *H01L 2924/01019* (2013.01); *H01L 2924/01087* (2013.01)

(56) References Cited

U.S. PATENT DOCUMENTS

| | | | |
|---|---|---|---|
| RE34,861 | E | 2/1995 | Davis |
| 6,410,940 | B1* | 6/2002 | Jiang et al. ............ 257/82 |
| 6,853,010 | B2 | 2/2005 | Slater, Jr. |
| 7,213,940 | B1 | 5/2007 | Van De Ven |
| 7,244,965 | B2 | 7/2007 | Andrews et al. |
| 7,549,786 | B2 | 6/2009 | Higley |
| 7,550,319 | B2* | 6/2009 | Wang et al. ............ 438/125 |
| 7,790,485 | B2 | 9/2010 | Nomura et al. |
| 7,791,061 | B2 | 9/2010 | Edmond |
| 7,821,023 | B2* | 10/2010 | Yuan et al. ............ 257/98 |
| D634,718 | S | 3/2011 | Chuang et al. |
| 7,967,652 | B2 | 6/2011 | Emerson |
| 8,044,418 | B2 | 10/2011 | Loh et al. |
| 8,058,088 | B2 | 11/2011 | Cannon |
| D650,343 | S | 12/2011 | Andrews et al. |
| 8,113,699 | B2* | 2/2012 | Tsutsumi ............ 362/538 |
| D658,139 | S | 4/2012 | Andrews et al. |
| 8,267,550 | B2 | 9/2012 | Wang |
| 8,309,974 | B2* | 11/2012 | Nakayama et al. ....... 257/81 |
| 8,337,214 | B2 | 12/2012 | Sheek |
| 8,379,407 | B2 | 2/2013 | Bibee |
| 8,421,089 | B2 | 4/2013 | Kim |
| D703,624 | S | 4/2014 | Andrews et al. |
| D704,154 | S | 5/2014 | Andrews et al. |
| 2002/0085390 | A1* | 7/2002 | Kiyomoto et al. ............ 362/555 |
| 2007/0057364 | A1* | 3/2007 | Wang et al. ............ 257/701 |
| 2007/0158668 | A1 | 7/2007 | Tarsa |
| 2008/0054286 | A1 | 3/2008 | Loh et al. |
| 2008/0173884 | A1 | 7/2008 | Chitnis |
| 2008/0179611 | A1 | 7/2008 | Chitnis |
| 2008/0258130 | A1 | 10/2008 | Bergmann |
| 2008/0291688 | A1* | 11/2008 | Higashi ............ 362/516 |
| 2009/0039379 | A1* | 2/2009 | Shiraishi et al. ............ 257/99 |
| 2009/0108281 | A1 | 4/2009 | Keller |
| 2009/0283787 | A1 | 11/2009 | Donofrio |
| 2010/0149771 | A1 | 6/2010 | Villard |
| 2010/0155763 | A1 | 6/2010 | Donofrio |
| 2010/0258819 | A1* | 10/2010 | Marfeld et al. ............ 257/80 |
| 2011/0068696 | A1 | 3/2011 | Van de Ven |
| 2011/0068702 | A1 | 3/2011 | Van de Ven |
| 2011/0090691 | A1 | 4/2011 | Markle |
| 2011/0220929 | A1 | 9/2011 | Collins |
| 2011/0309396 | A1 | 12/2011 | Wang et al. |
| 2012/0068198 | A1 | 3/2012 | Andrews |
| 2012/0091496 | A1* | 4/2012 | Chien et al. ............ 257/99 |
| 2012/0193648 | A1 | 8/2012 | Donofrio |
| 2012/0193649 | A1 | 8/2012 | Donofrio |
| 2012/0193660 | A1 | 8/2012 | Donofrio |
| 2012/0305949 | A1 | 12/2012 | Donofrio |
| 2013/0160248 | A1* | 6/2013 | Keyaki et al. ............ 24/388 |
| 2013/0240918 | A1* | 9/2013 | Herrmann et al. ............ 257/88 |
| 2013/0256710 | A1 | 10/2013 | Andrews |
| 2013/0270581 | A1 | 10/2013 | Lowes |
| 2013/0322068 | A1* | 12/2013 | Clark et al. ............ 362/235 |
| 2014/0104865 | A1 | 4/2014 | Hutchins |

FOREIGN PATENT DOCUMENTS

| | | |
|---|---|---|
| EP | 002114934-0002 | 10/2012 |
| EP | 2008316 | 3/2014 |
| JP | 1485299 | 11/2013 |

OTHER PUBLICATIONS

Japanese Invitation for Amendment for Application No. 2012-024518 dated Jul. 30, 2013.
Japanese Decision of Registration for Design Application No. 2012-024518 dated Sep. 24, 2013.
Restriction Requirement for U.S. Appl. No. 29/417,704 dated Oct. 2, 2013.
Restriction Requirement for U.S. Appl. No. 29/433,842 dated Oct. 2, 2013.
Chinese Office Action for Application No. 201230476421.3 dated Oct. 14, 2013.
Notice of Allowance for U.S. Appl. No. 29/417,704 dated Nov. 26, 2013.
Notice of Allowance for U.S. Appl. No. 29/433,842 dated Dec. 6, 2013.
Chinese Notice of Grant for Application No. 201230476421.3 dated Jan. 16, 2014.
U.S. Appl. No. 13/424,699 dated Mar. 20, 2012.
Japanese Office Action for Application No. 2012-024518 dated Feb. 26, 2013.
Restriction Requirement for U.S. Appl. No. 13/796,045 dated Apr. 14, 2014.
Restriction Requirement for Application No. 13/796,9549 dated Sep. 5, 2014.
Non-Final Office Action for U.S. Appl. No. 13/796,045 dated Aug. 21, 2014.

* cited by examiner

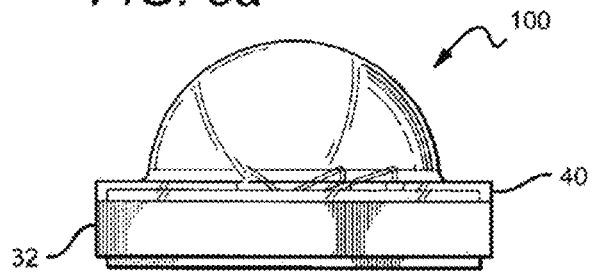
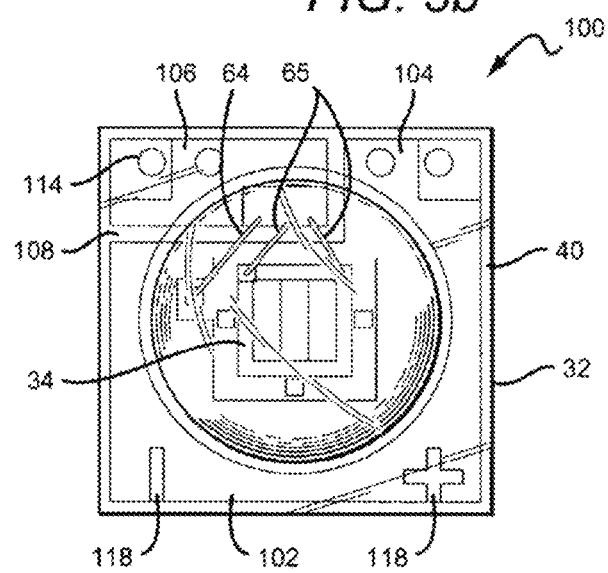

MULTI-DIE LED PACKAGE

RELATED APPLICATIONS

This application is a continuation-in-part of patent application Ser. No. 11/982,275, filed Oct. 31, 2007, currently pending, and is also a continuation-in-part of patent application Ser. No. 13/017,502, filed Jan. 31, 2011, also currently pending, which is based on Provisional Patent Application Ser. No. 61/384,625, filed Sep. 20, 2010 and Provisional Patent Application Ser. No. 61/390,963, filed Oct. 7, 2010. The contents of such prior applications are incorporated herein by reference.

FIELD OF THE INVENTION

This invention relates to light emitting diodes, and in particular to light emitting diode packages having multiple LEDs and a molded lens.

BACKGROUND OF THE INVENTION

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, focusing and the like. An LED package also includes electrical leads, contacts or traces for electrically connecting the LED package to an external circuit. In a typical LED package 10 illustrated in FIG. 1a, an LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 containing a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup instead of being reflected). In addition, heat retention may be an issue for a package such as the package 10 shown in FIG. 1a, since it may be difficult to extract heat through the leads 15A, 15B.

A conventional LED package 20 illustrated in FIG. 1b may be more suited for high-power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the carrier 23. The mounted LED chips 22 are then covered with an encapsulant 26, which may provide environmental and mechanical protection to the chips while also acting as a lens. The metal reflector 24 is typically attached to the carrier by means of a solder or epoxy bond.

While a package such as the package 20 illustrated in FIG. 1b may have certain advantages for high-power operation, there may be a number of potential problems associated with using a separate metal piece as a metal reflector. For example, small metal parts may be difficult to manufacture repeatable with a high degree of precision at a reasonable expense. In addition, since the reflector is typically affixed to a carrier using an adhesive, several manufacturing steps may be required to carefully align and mount the reflector, which may add to the expense and complexity of the manufacturing process for such packages.

For higher powered operation it may also be difficult to transfer dissipate heat generated by the LED chip 22. Submounts can be made of materials such as ceramics that are robust but do not efficiently conduct heat. Heat from the LED chip passes into the submount below the LED chip, but does not efficiently spread outward from below the LED where it can then dissipate. Heat from the LED tends to localize below the LED and can increase as operation of the LED package. This increased heat can result is reduced lifetime or failure of the package.

Light emitting diode (LED) lighting systems are becoming more prevalent as replacements for existing lighting systems. LEDs are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and contain no lead or mercury. In many applications, one or more LED chips (or dies) are mounted within an LED package or on an LED module, and such a device may make up part of a lighting unit, lamp, "light bulb" or more simply a "bulb," which includes one or more power supplies to power the LEDs. An LED bulb may be made with a form factor that allows it to replace a standard threaded incandescent bulb, or any of various types of fluorescent lamps.

Care must be taken in the design of multi-chip LED devices. LEDs of different sizes have different current densities for the same drive current. As chips heat up, forward voltage drops, which, when chips are arranged in parallel will cause a chip to draw more current relative to its neighbors until current draw increases current density to a degree that forward voltage increases. The forward voltage distribution in some LED chips can hurt a multi-chip parallel arrangement as current draw will not be balanced, which can unbalance the optimal current/chip efficiency for a multi-chip device. It should be noted that large chips have a lower forward voltage for the same drive current than smaller chips due to current density.

SUMMARY OF THE INVENTION

The present invention is a light-emitting device which comprises (a) a submount having front and back sides and including a ceramic layer; (b) an array of light-emitting diodes (LEDs) on the front side; and (c) a lens overmolded on the submount and covering the LED array. (The terms "front" and "back" as used herein may also be referred to interchangeably as "top" and "bottom.")

In some embodiments, the ceramic layer of the inventive light-emitting device is of aluminum nitride.

In certain embodiments of the inventive light-emitting device, the submount comprises at least two electrically-conductive contact pads on the front side, and each LED is secured with respect to one of the contact pads. In some such embodiments, the contact pads each comprise metallization with copper. In certain of these embodiments, the copper metallization has a thickness of about 40-60 microns. In other embodiments, the contact pads each have an outer layer of silver. The outer layer may have a thickness of about 0.2-0.5 microns.

In some embodiments of the inventive light-emitting device, the contact pads each have an inner layer of titanium between the copper and the ceramic. The inner layer may have a thickness of about 0.6 microns.

In certain embodiments, the submount has at least three of the contact pads, including a positive contact pad, a negative contact pad, and at least one intermediate contact pad. In such embodiments, a first subset of the LEDs is secured with respect to one of the positive and negative contact pads, a second subset of the LEDs is secured with respect to one of the at least one intermediate contact pads, and the first and second subsets are mutually-exclusive and have the same number of LEDs. In certain of these embodiments, the array includes eight LEDs, and certain others, the array includes forty-eight LEDs.

In some embodiments, there is one intermediate contact pad and each LED of the array is in one of the two subsets.

In another embodiment of the inventive light-emitting device, each LED has a pad side and an opposite side, and each LED is electrically connected to an adjacent contact pad with at least one wirebonded conductor; more than one wirebonded conductors provides electrical redundancy for the electrical connections.

In some embodiments, the inventive light-emitting device is configured to refract LED-emitted light toward a preferential direction. In some of these embodiments, the LED array defines an emitter axis, and the lens has an outer surface a centerline which is offset from the emitter axis toward the preferential direction. Further, in some of these embodiments, the lens is shaped for refraction of LED-emitted light toward the preferential direction. In some of these embodiments of the inventive light-emitting device, the lens is asymmetric.

The term "asymmetric," as used herein with respect to lenses, when unmodified by any further limiting description, refers to a lens shape which is not rotationally symmetric about any axis perpendicular to its base plane. Types of asymmetric lenses include without limitation bilaterally symmetric lenses.

As used herein, the term "LED-populated area" means an area (i.e., an area on the submount) the outer boundaries of which include the outermost edges of the outermost LEDs (of the LED array) in any direction. As used herein, the term "aspect ratio" means the ratio of the maximum cross-dimension of the LED-populated area to the maximum of the cross-dimensions orthogonal thereto.

As used herein, the term "emitter axis" means the line orthogonal to the plane defined by the LED-populated area and passing through the geometric center of the minimum-area rectangle bounding the LED-populated area, i.e., the center of the rectangle of minimum area which includes all of the LED-populated area.

In some embodiments, the device further includes at least electrically-conductive mount pads on the back side of the submount for electrical connection to the device. The submount of the inventive light-emitting device may have electrically-conductive vias which provide electrical connection between the mount pads and the contact pads.

The array of the device defines an LED-populated area on the submount> In some embodiments, the LED-populated area has an aspect ratio greater than 1. In some of these embodiments, the aspect ratio may be at least 2, and in some, the aspect ratio may be about 3.

In certain embodiments, the LED-populated area is rectangular. In some such embodiments, the array includes at least eight LEDs positioned in two rows of four LEDs in each row; in other such embodiments, the array includes forty-eight LEDs positioned in four rows of twelve LEDs in each row.

In another aspect of the inventive light-emitting device, embodiments of the device comprise (a) a submount having front and back sides, an electrically-insulating layer, at least three front-side electrically-conductive contact pads including a positive contact pad, a negative contact pad, and at least one intermediate contact pad and (b) an array of light-emitting diodes (LEDs) on the front side, the array including a first subset of the LEDs secured with respect to one of the positive and negative contact pads, and a second subset of the LEDs secured with respect to one of the at least one intermediate contact pads, the first and second subsets being mutually-exclusive and having the same number of LEDs. In some of these embodiments, each LED has a pad side and an opposite side and each LED is electrically connected to an adjacent contact pad with at least one wirebonded conductor. Some of the wirebonded connections provide connectivity redundancy.

Another aspect of this invention is a light-emitting device including a submount having front and back sides and including a ceramic layer, an array of light-emitting diodes (LEDs) on the front side, and at least two electrically-conductive mount pads on the back side for electrical connection of the device. In some such devices, the ceramic material is aluminum nitride.

In certain embodiments of the device, there are two intermediate contact pads and a third mutually-exclusive subset of LEDs of the array. Each of the LEDs is in one of the three subsets. In some such embodiments, the LED-populated area is rectangular.

In certain other embodiments, (a) one of the positive and negative contact pads is an innermost pad and is adjacent to a first edge of the submount, (b) a first intermediate contact pad substantially surrounds the innermost pad on three sides thereof other than the first-edge-adjacent side thereof, and (c) the other of the positive and negative contact pads substantially surrounds the first intermediate contact pad on three sides thereof other than the first-edge-adjacent side thereof. In some of these embodiments, the LED-populated area is rectangular having a smaller dimension adjacent to the first edge of the submount. Some of these embodiments may include a second intermediate contact pad which substantially surrounds the first intermediate contact pad on three sides thereof other than the first-edge-adjacent side thereof.

Another aspect of this invention is a light-emitting device including (a) a submount having an electrically-insulating layer, a front side, and at least three front-side electrically-conductive contact pads, including a positive contact pad, a negative contact pad, and at least one intermediate contact pad; and (b) an array of LEDs on the front side, the array defining an LED-populated area having an aspect ratio greater than 1, the array including first and second mutually-exclusive subsets of the LEDs, the LEDs of each of the subsets being electrically in parallel with each other and the subsets being electrically in series. In some of these devices, the LEDs of the first subset are on the positive contact pad and the LEDs of the second subset are on the intermediate contact pad.

Still another aspect of this invention is a light-emitting device including a submount and a rectangular LED array thereon defining an LED-populated area having an aspect ratio greater than 1, the LED array including first and second subsets of the LEDs. The LEDs within each of the subsets are electrically in parallel, and the first and second subsets are electrically in series with each other. Some of these devices also have at least three electrically-conductive contact pads, including a positive contact pad, a negative contact pad, and at least one intermediate contact pad. In some of these devices, the first subset of the LEDs is secured with respect to one of the positive and negative contact pads, and the second subset of the LEDs is secured with respect to one of the at least one intermediate contact pads. Such device may also have a lens on the submount covering the LED array. Some such lenses may be overmolded on the submount. The lenses may be asymmetric.

Yet another aspect of this invention is a submount including first, second and third contact pads, the second contact pad substantially surrounding the first contact pad on at least three sides, and the third contact pad substantially surrounding the second contact pad on at least three sides. The first contact pad may be a positive contact pad, the second an intermediate contact pad, and the third a negative contact pad.

Still another aspect of this invention is a light-emitting device including (a) a submount including first, second and third contact pads, the second contact pad substantially surrounding the first contact pad on at least three sides, and the third contact pad substantially surrounding the second contact pad on at least three sides, and (b) an LED array on the contact pads. In some of these devices, the first contact pad is a positive contact pad, the second is an intermediate contact pad, and the third is a negative contact pad.

In descriptions of this invention, including in the claims below, the terms "comprising," "including" and "having" (each in their various forms) and the term "with" are each to be understood as being open-ended, rather than limiting, terms.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

BRIEF DESCRIPTION OF THE DRAWINGS

FIG. 2b is a side view of the LED package shown in FIG. 2a.

FIG. 2c is a bottom view of the LED package shown in FIG. 2a.

FIG. 2d is an upper perspective view of the LED package shown in FIG. 2a.

FIG. 2e is a bottom perspective view of the LED package shown in FIG. 2a.

FIG. 2f is an exploded view of the LED package shown in FIG. 2a.

FIG. 3a is a side view of another embodiment of an LED package according to the present invention.

FIG. 3b is top view of the LED package shown in FIG. 3a.

FIG. 3c is a bottom view of the LED package shown in FIG. 3a.

FIG. 3d is an upper perspective view of the LED package shown in FIG. 3a.

FIG. 3e is a bottom perspective view of the LED package shown in FIG. 3a.

FIG. 4b is a bottom perspective view of the LED package shown in FIG. 2a.

FIG. 6b is another sectional view of the lens mold shown in FIG. 5a.

Figure 8:
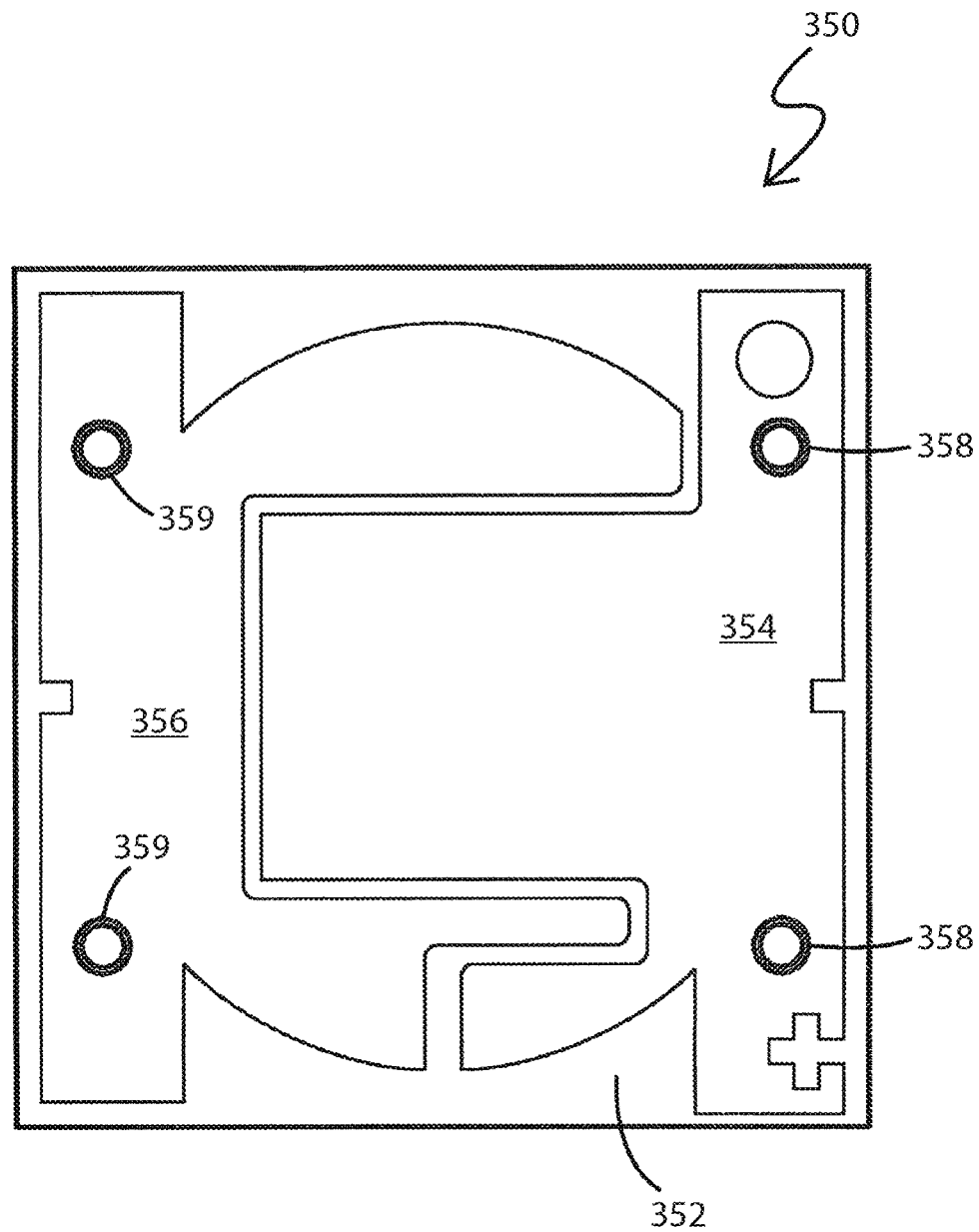
FIG. 8 is a top-down view of an LED submount according to example embodiments of the present invention.

9 makes use of the submount of FIG. 8 and the lens and its distortion are omitted for clarity.

Figure 10:
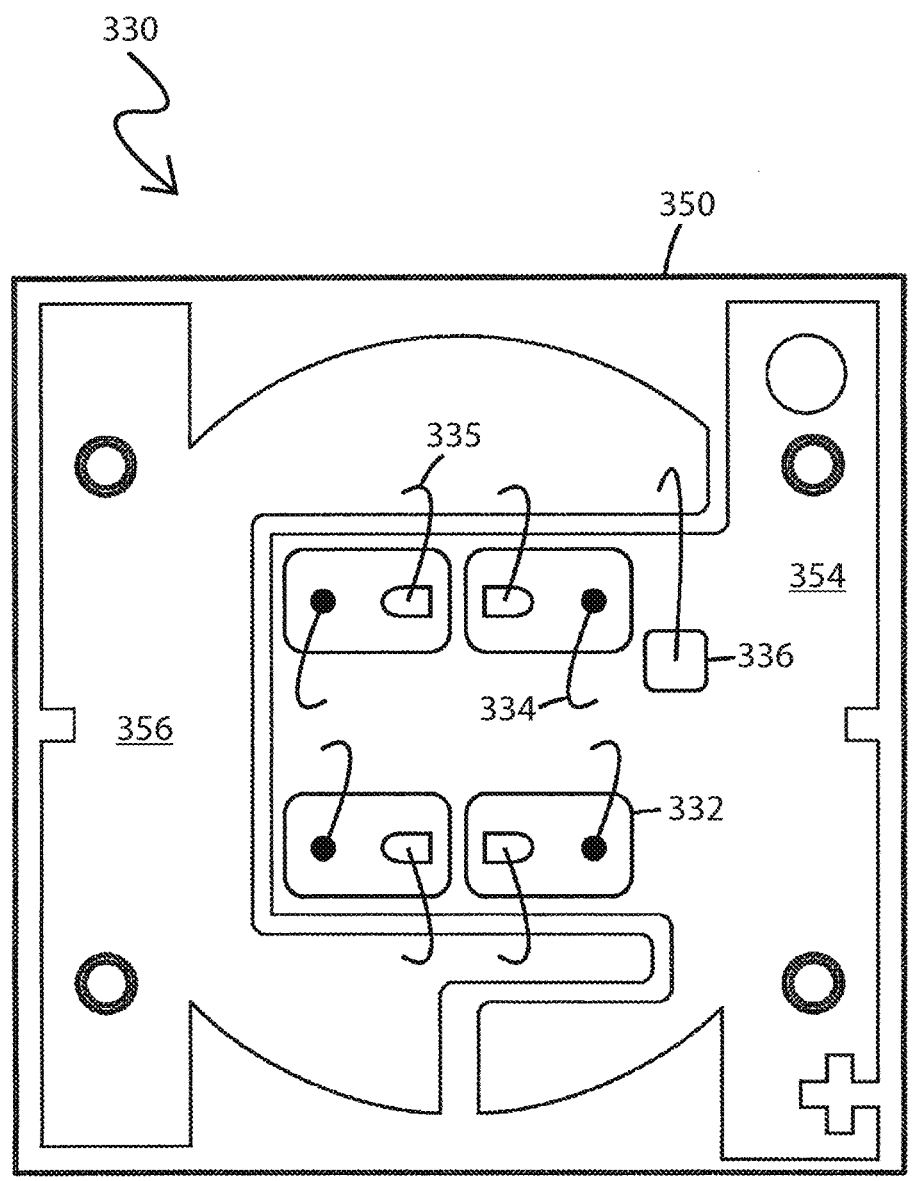

FIG. 10 is a top-down view of a multi-chip LED device according to another embodiment of the invention. In this case, the chips are sideview chips with two wire bonds on top of each LED chip are used to connect the chip. The device of FIG. 10 again makes use of the submount of FIG. 8 and the lens and its distortion are omitted for clarity.

Figure 9:
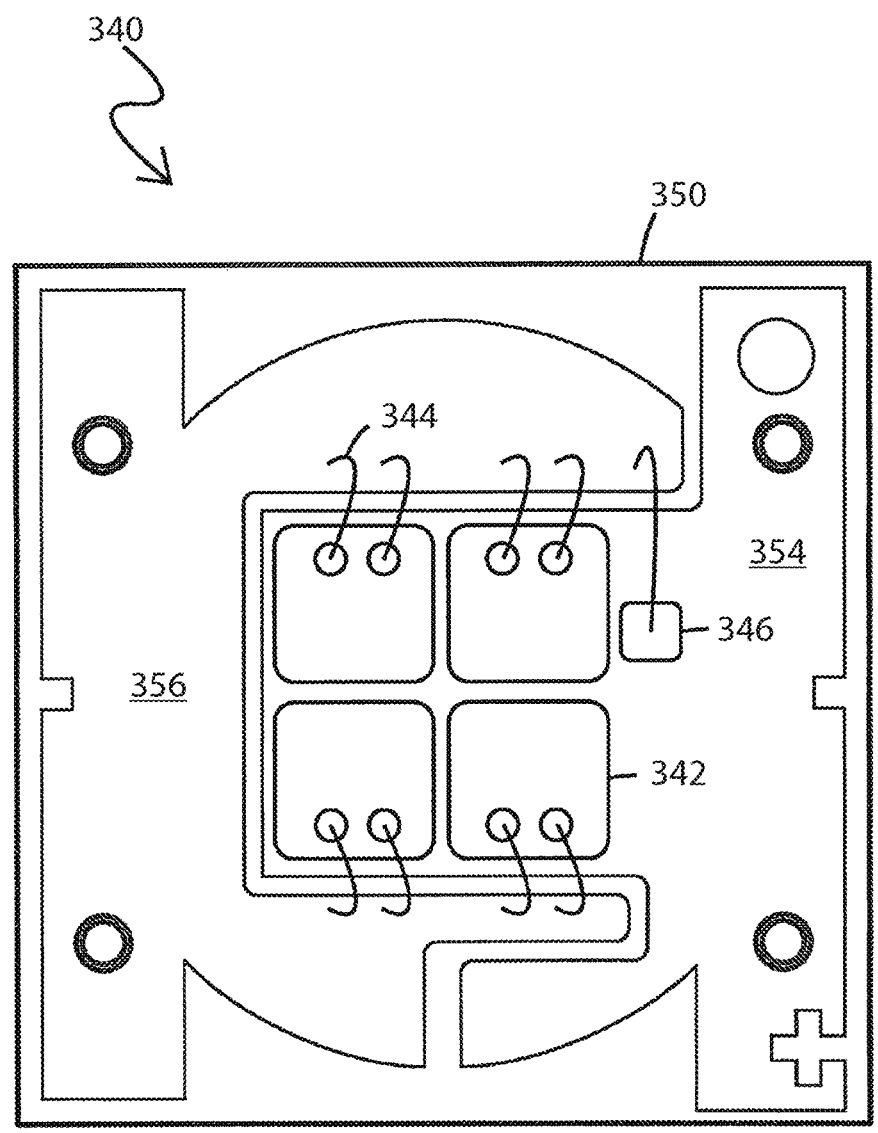
FIG. 9 is a top-down view of a multi-chip LED device according to an embodiment of the invention. In this case, each LED is connected via the bottom mounting surface of the chip and a wire bond on top of the chip. The device of FIG.
Figure 11:
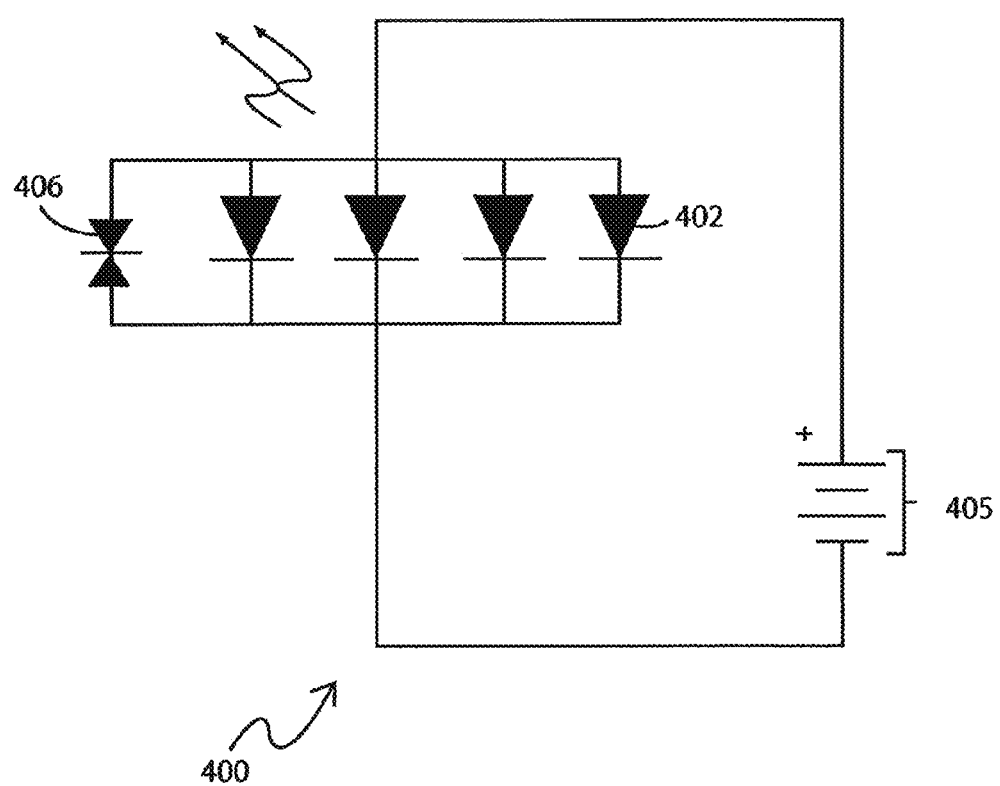

FIG. 11 is an electrical schematic diagram of the LED devices of FIGS. 9 and 10.

Figure 12:
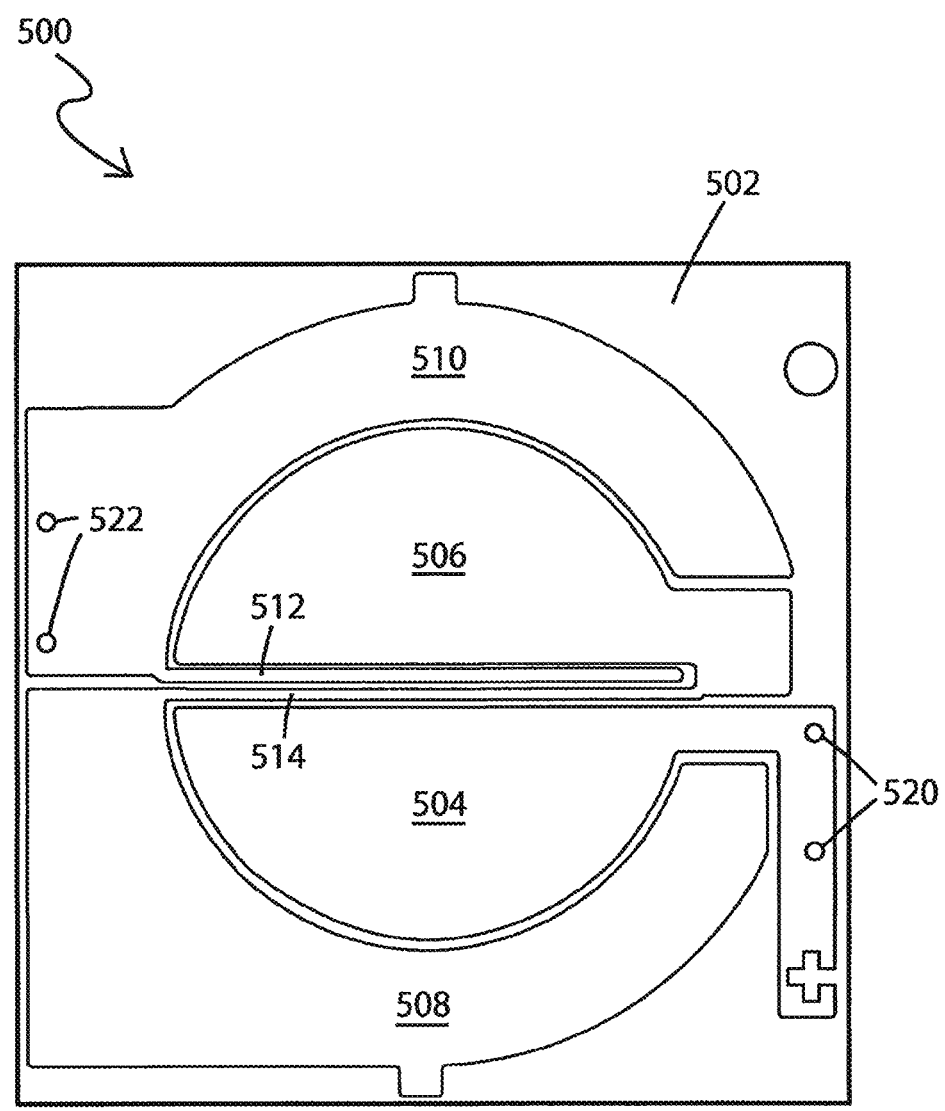

FIG. 12 is a top-down view of an LED submount according to other example embodiments of the present invention.

FIGS. 13-16 are top-down views of various high density, multi-chip LED devices according to example embodiments of the invention. The embodiments shown in FIGS. 13-16 all make use of the submount of FIG. 12 and the lens and its distortion are omitted for clarity.

Figure 17:
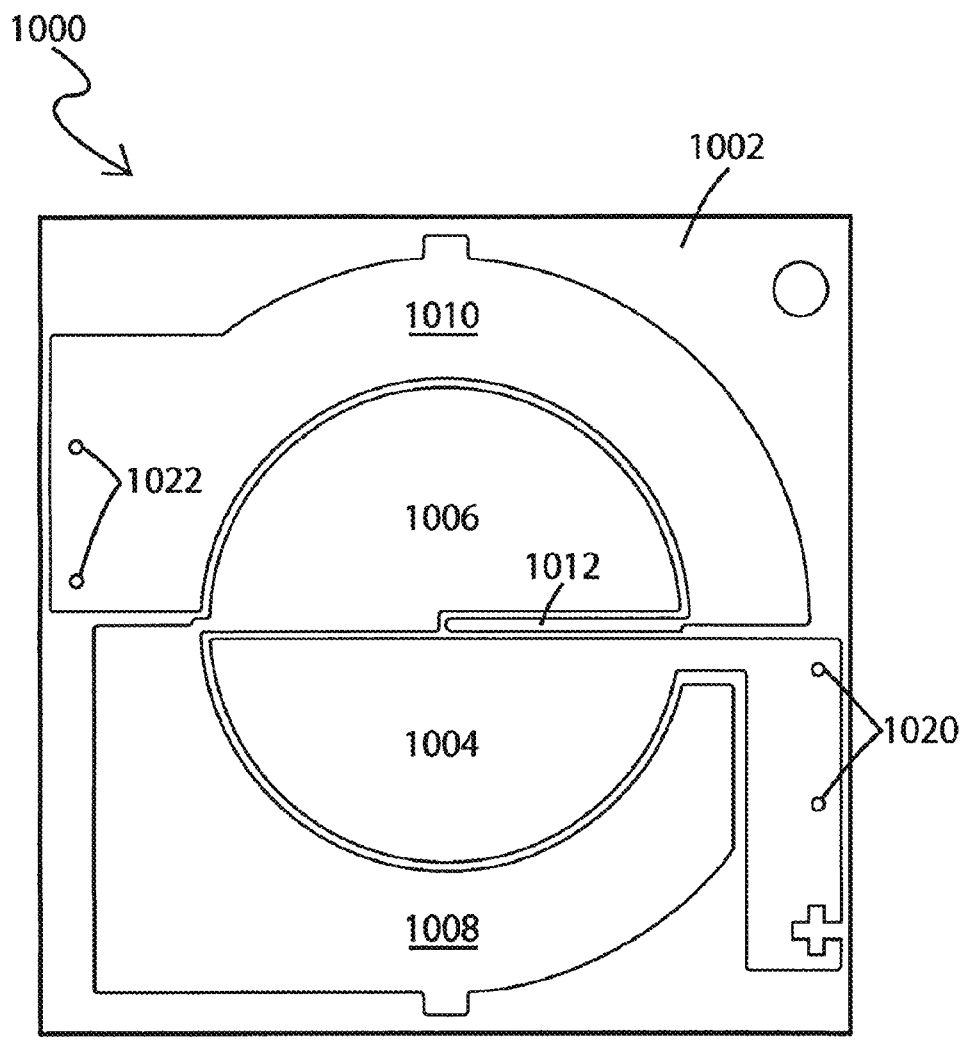

FIG. 17 is a top-down view of an LED submount according to further example embodiments of the present invention.

Figure 18:
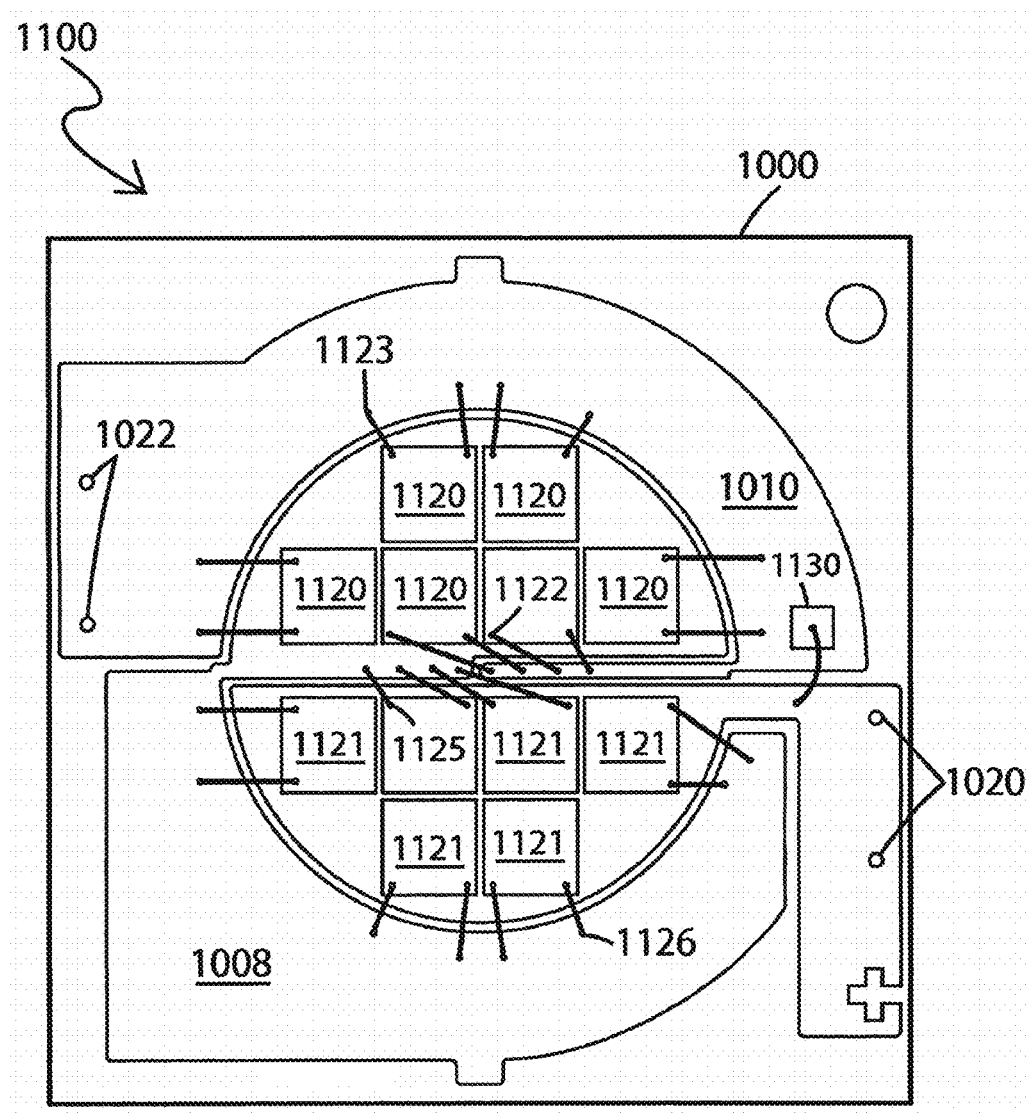
Figure 19:
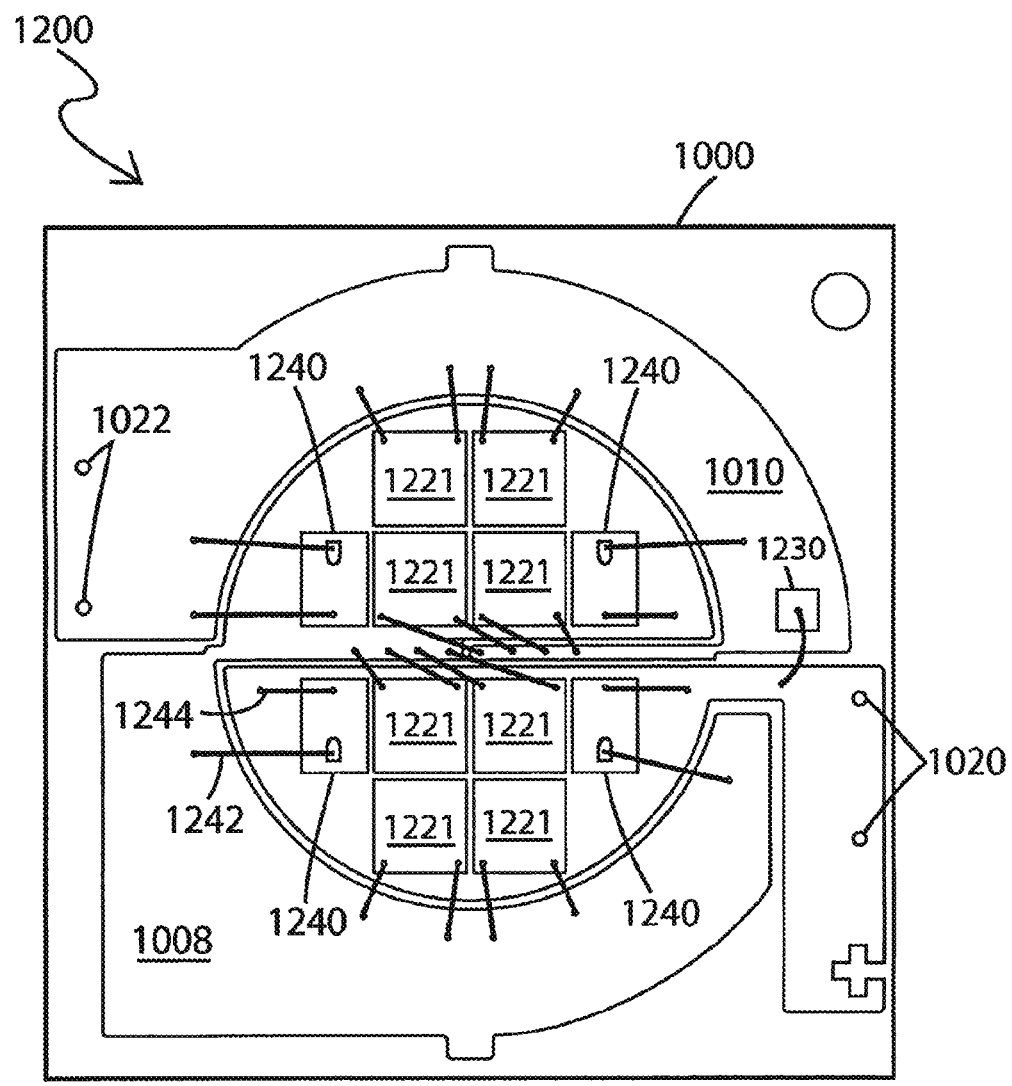

FIGS. 18 and 19 are top-down views of various high density, multi-chip LED devices according to example embodiments of the invention. The embodiments shown in FIGS. 18 and 19 make use of the submount of FIG. 17 and the lens and its distortion are omitted for clarity.

Figure 20:
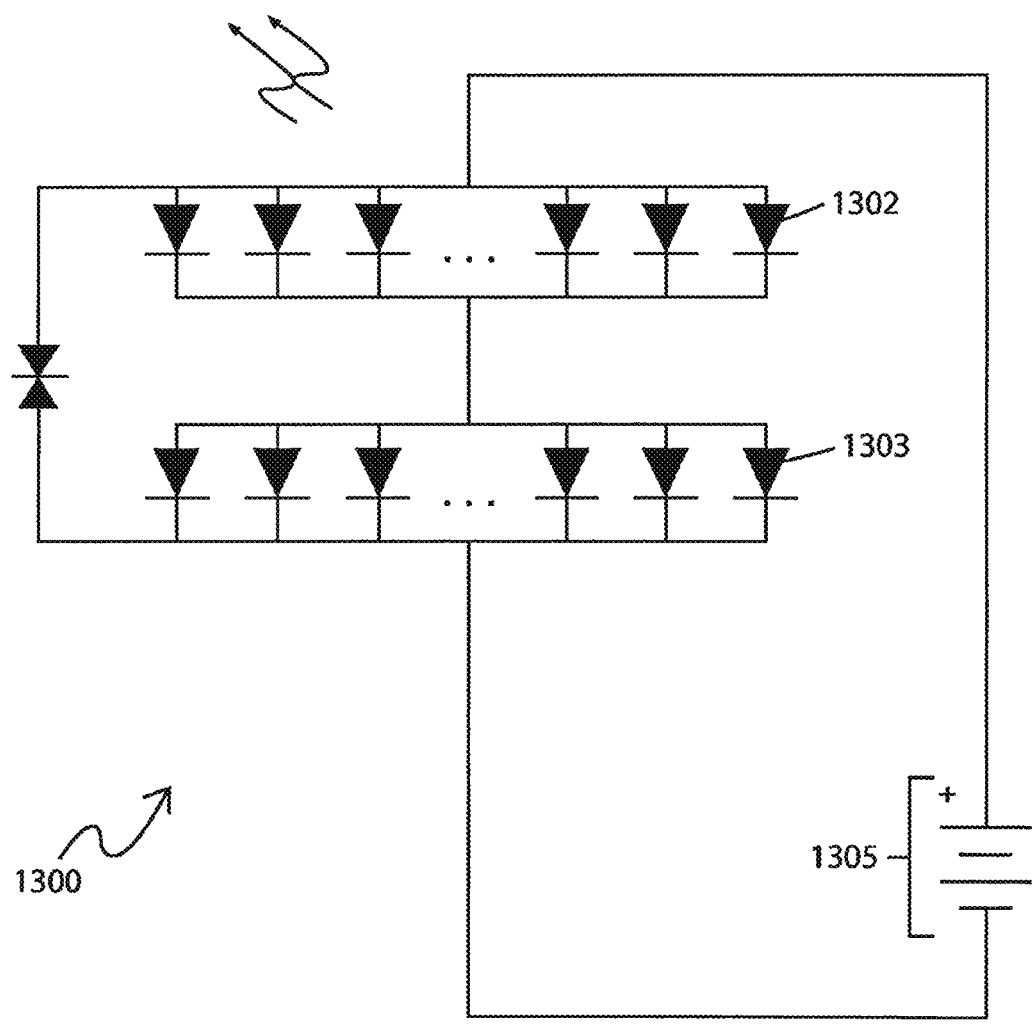

FIG. 20 is a generalized electrical schematic diagram of the LED devices of FIGS. 12-15.

Figure 21:
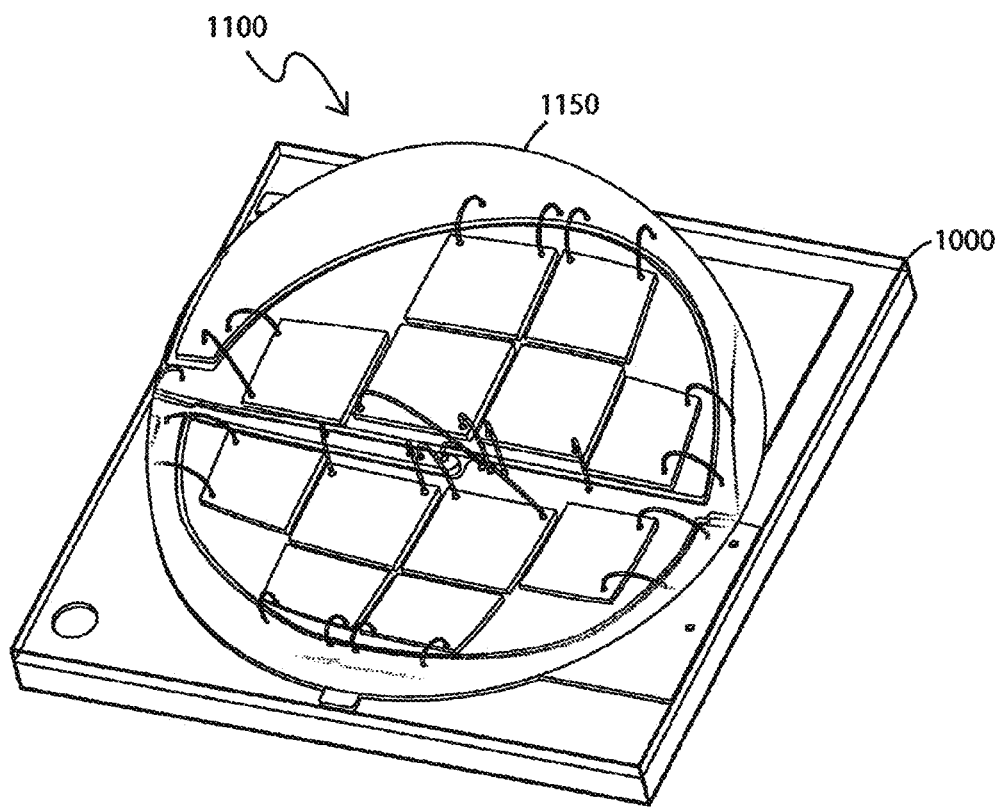

FIG. 21 is a perspective view of a complete high-density multi-chip LED device according to an example embodiment of the invention.

Figure 22:
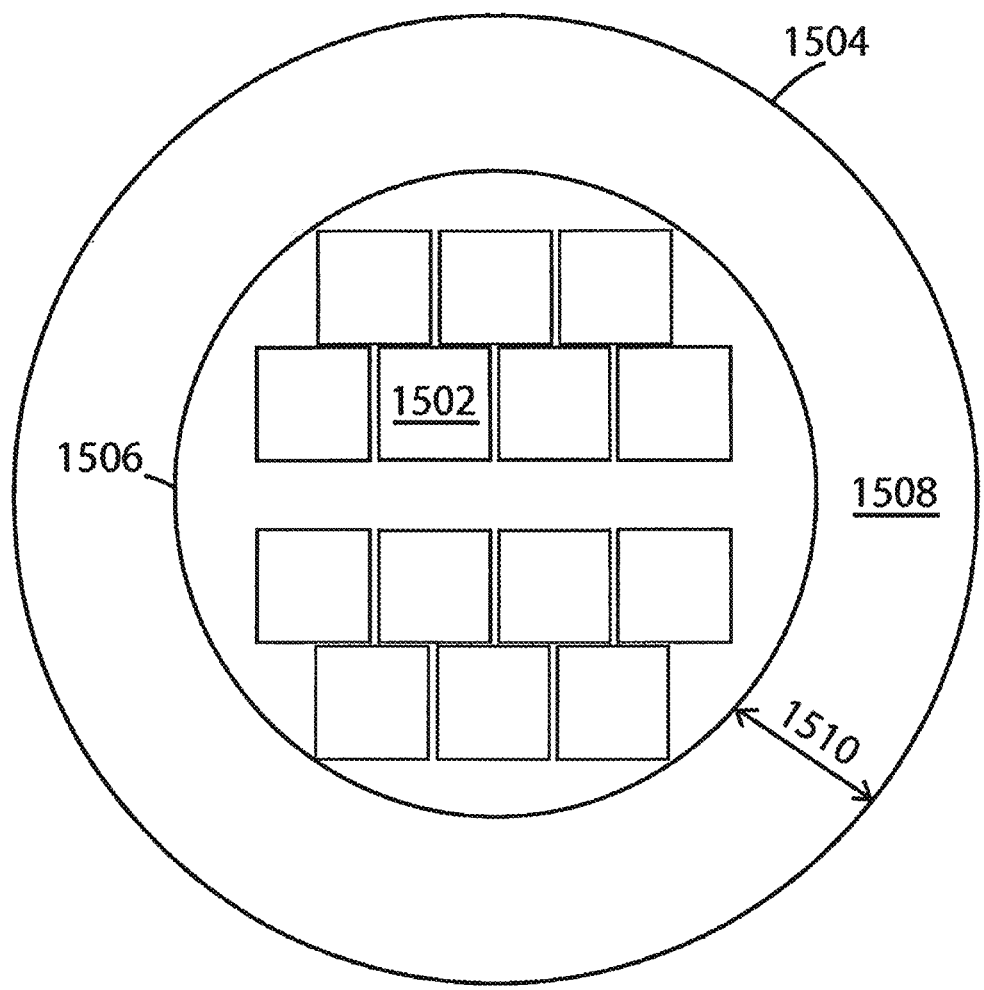

FIG. 22 is a top-down, schematic illustration of an embodiment of the invention indicating how appropriate lens size is determined.

Figure 23A:
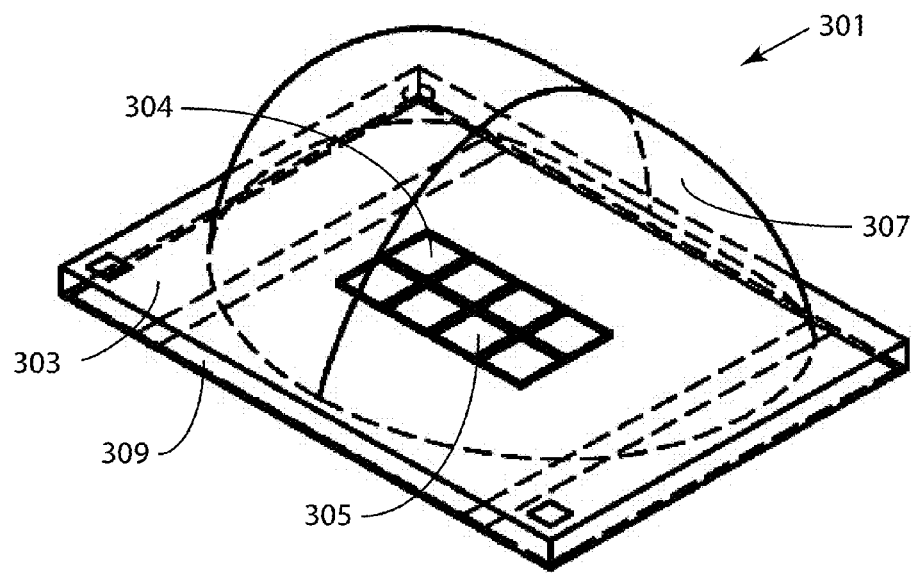

FIG. 23a is a perspective drawing of an embodiment of the inventive light-emitting device.

Figure 23B:
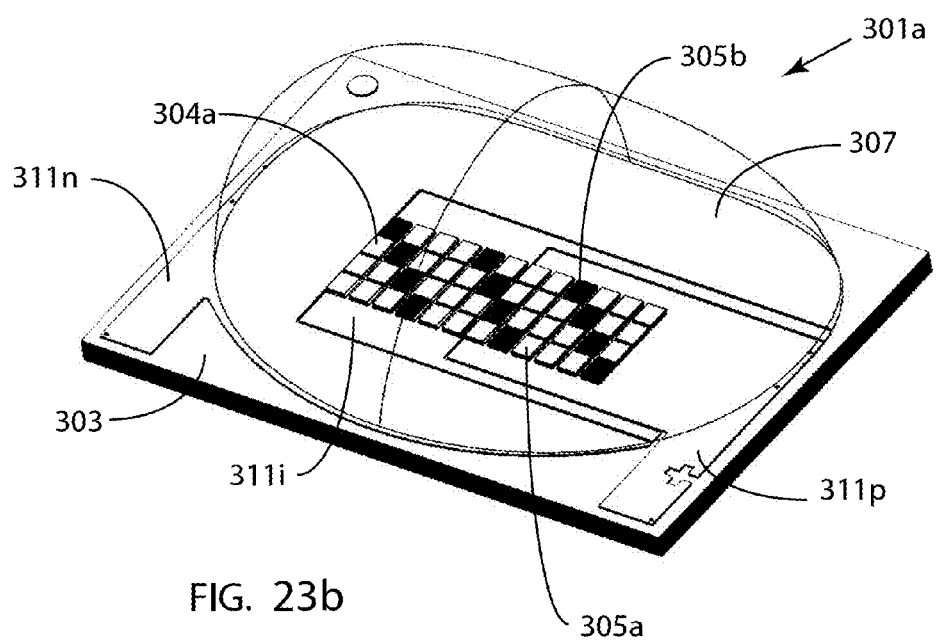

FIG. 23b is a perspective drawing of an alternative embodiment of the inventive light-emitting device.

Figure 23C:
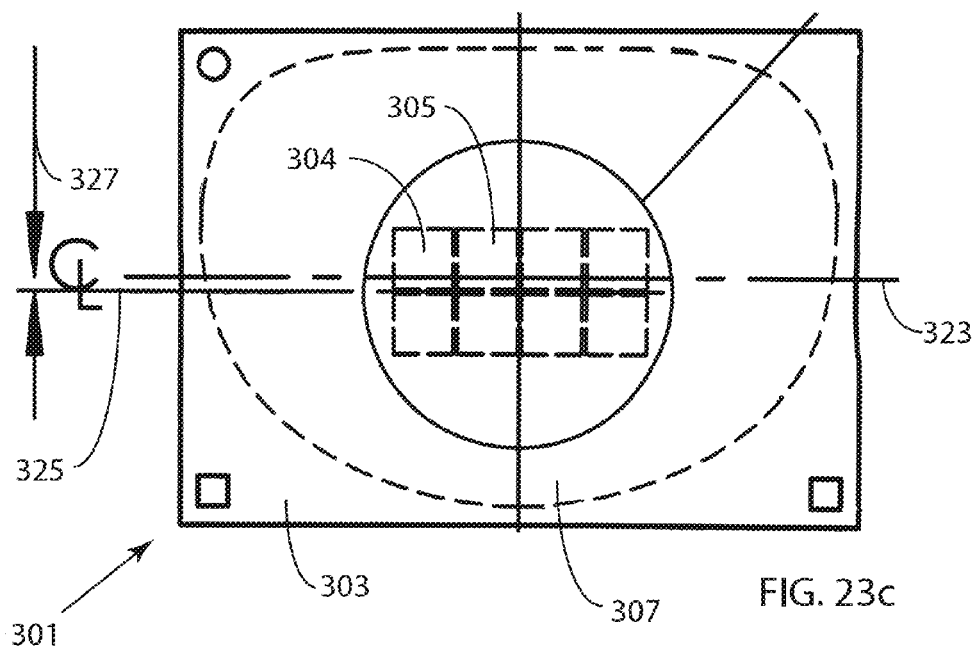
Figure 23D:
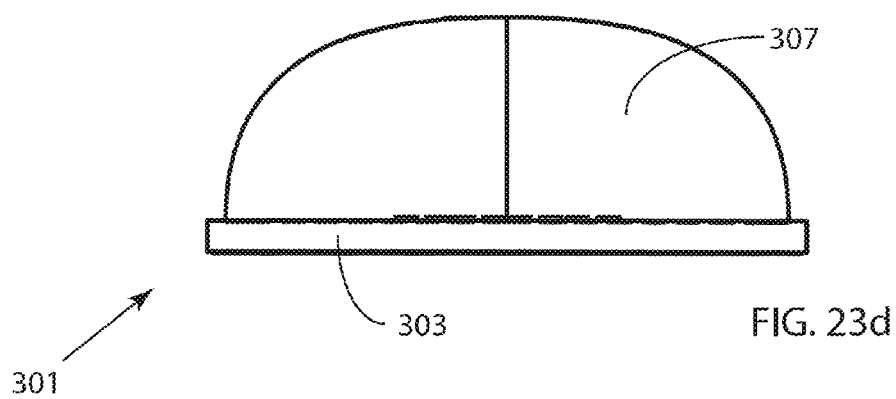
Figure 23E:
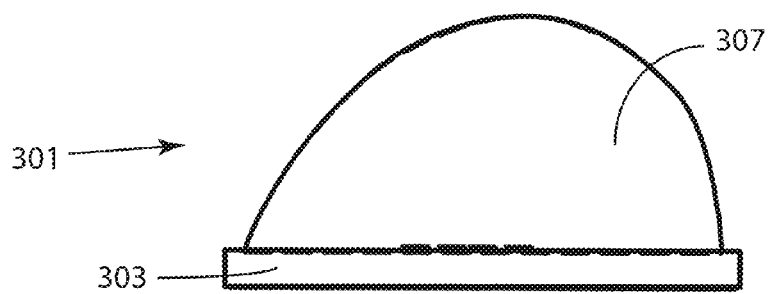

FIGS. 23c, 23d and 23e are front (top), side and end views of the device of FIG. 23a.

Figure 24A:
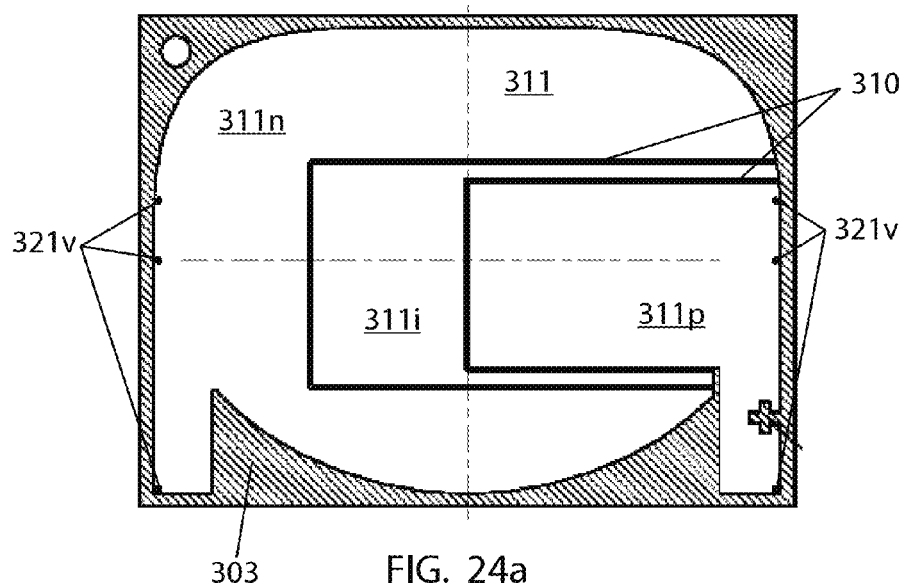

FIG. 24a is a front view of the submount of the devices of FIGS. 23a and 23b.

Figure 24B:
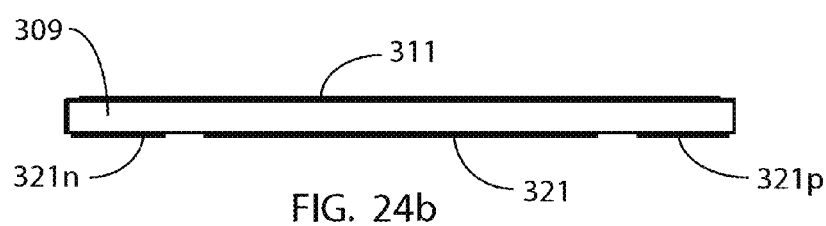

FIG. 24b is an edge view of the submount of FIG. 24a.

Figure 24C:
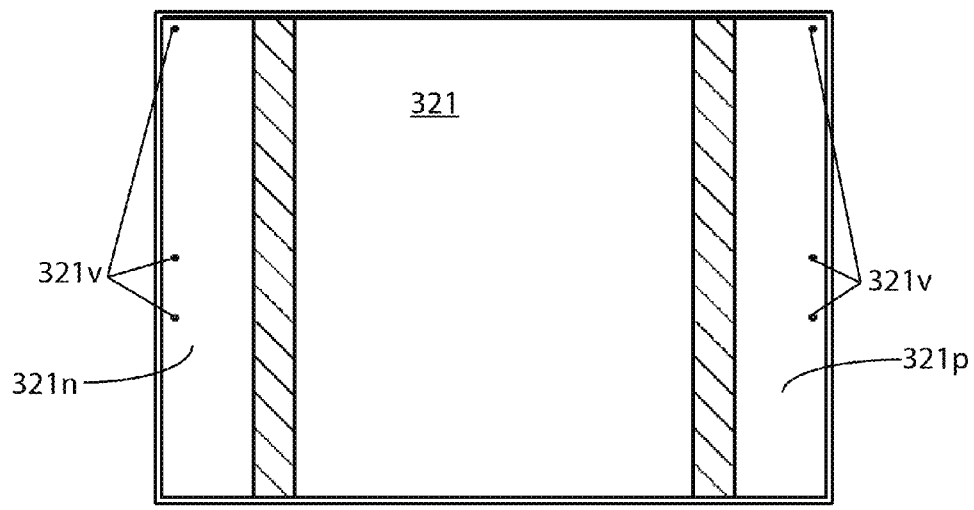

FIG. 24c is a back view of the submount of FIG. 24a.

Figure 25:
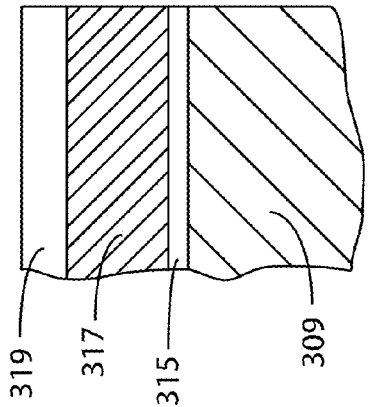

FIG. 25 is a detailed view of the upper right corner of the submount of FIG. 24b. The layers of FIG. 25 are not to scale.

Figure 26:
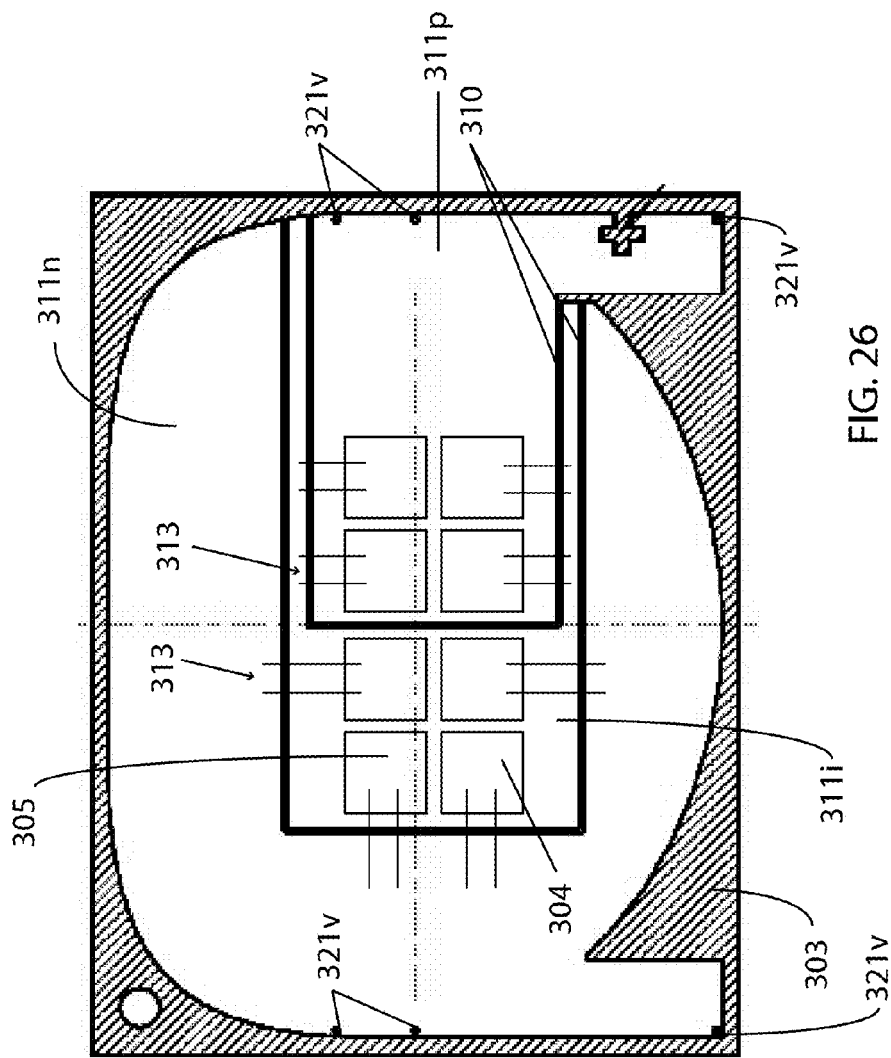

FIG. 26 is a front view of the submount of the device of FIG. 23a showing the eight LEDs on the submount.

Figure 27:
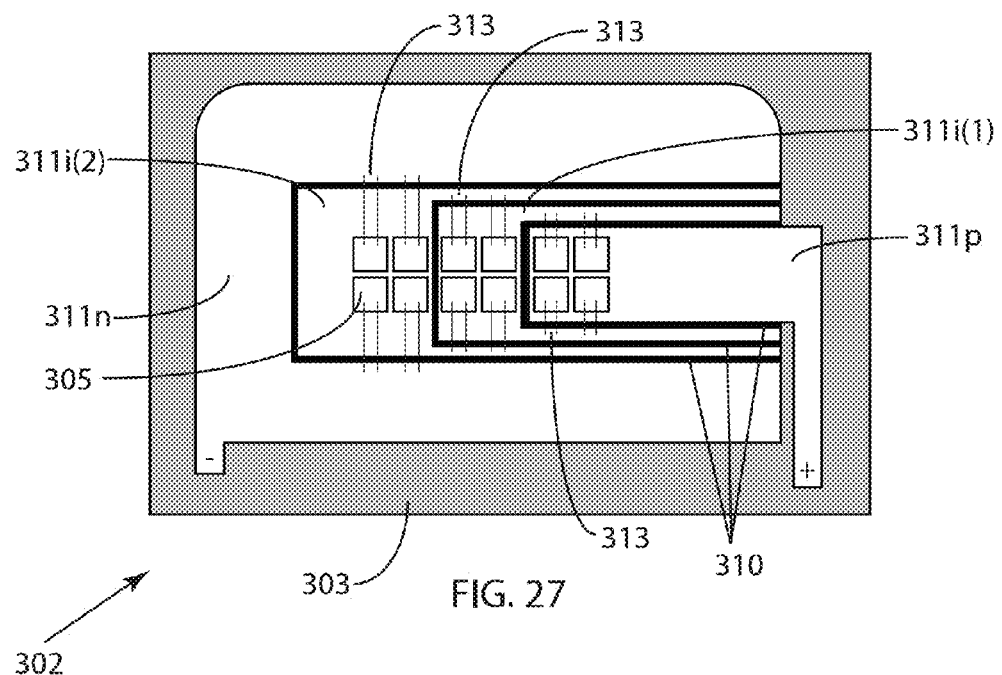

FIG. 27 is a front view of a submount with two intermediate contact pads and an array of twelve LEDs.

Figure 28:
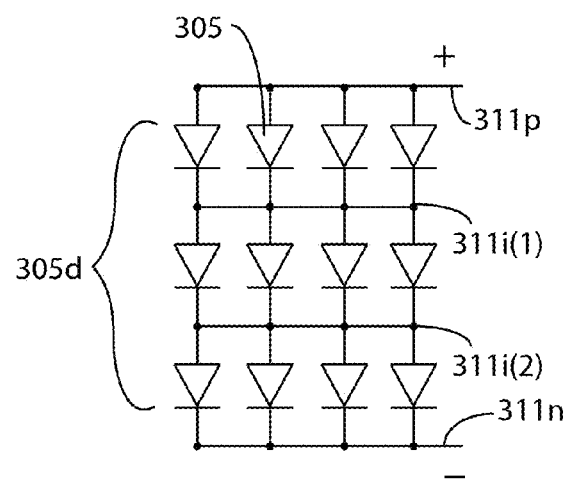

FIG. 28 is partial circuit diagram illustrating the electrical connectivity of the LEDs of the device of FIG. 27.

DETAILED DESCRIPTION OF CERTAIN EMBODIMENTS

The present invention is directed to compact, simple and efficient LED packages and methods for manufacturing same. Different embodiments can comprise one or more high-power LEDs that typically operate at elevated temperatures. Packages according to the present invention can include features to provide for improved thermal management by spreading the heat from the LED. The heat can then dissipate into the ambient. The packages according to the present invention can also comprise a lens molded directly over the one or more LEDs to protect the LED while still allowing for efficient emission characteristics. The present invention is also directed to methods for fabricating LED packages using processing steps that allow for the simultaneous formation of a plurality of packages. This can reduce the manufacturing complexity and cost of LED package fabrication.

The present invention provides low cost, relatively small size LED packages that provide an efficient but small light source. The packages according to the present invention are particularly adapted to surface mount technologies and provide features that allow for the good thermal dissipation, allowing the packages to operate at elevated power levels without overheating.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

The present invention can be used in with many different solid state emitters with the embodiments of the invention below being described in relation to LEDs, and in particular to white emitting LEDs and LED packages. It is understood that the present invention can also use other solid state emitter packages beyond the embodiment shown. The present invention can also be used with multiple emitter packages, such as LED packages having more than one LED. The present invention can be used in any application wherein a conversion material is used to down-convert the wavelength of light from an emitter, and the discussion of the present invention with reference to the following embodiment should not be construed as limiting to the that particular embodiment or similar embodiments.

FIGS. 2a through 2g show one embodiment of an LED package 30 according to the present invention generally comprising a substrate/submount ("submount") 32 with one or more LEDs emitting the same or different colors. In the embodiment shown, a single LED 34 is mounted on the submount 32. The LED 34 can have many different semiconductor layers arranged in different ways. LED structures and their fabrication and operation are generally known in the art and only briefly discussed herein. The layers of the LED 34 can be fabricated using known processes with a suitable process being fabrication using metal organic chemical vapor deposition (MOCVD). The layers of the LEDs 34 generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in the LED 34, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide are typically not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

The LED 34 can also comprise a conductive current spreading structure 36 and wire bond pads 38 on its top surface, both of which are made of a conductive material and can be deposited using known methods. Some materials that can be used for these elements include Au, Cu, Ni, In, Al, Ag or combinations thereof and conducting oxides and transparent conducting oxides. The current spreading structure 36 generally comprises conductive fingers 37 arranged in a grid on the LED 34 with the fingers spaced to enhance current spreading from the pads 38 into the LED's top surface. In operation, an electrical signal is applied to the pads 38, such as through a wire bond as described below, and the electrical signal spreads through the fingers 37 of the current spreading structure 36 and the top surface into the LED 34. Current spreading structures are often used in LEDs where the top surface is p-type, but can also be used for n-type materials.

The LED can be coated with one or more phosphors with the phosphors absorbing at least some of the LED light and emitting a different wavelength of light such that the LED emits a combination of light from the LED and the phosphor. In one embodiment, the LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 32 can be formed of many different materials with a preferred material being electrically insulating. Suitable materials include, but are not limited to ceramic materials such as aluminum oxide, aluminum nitride or organic insulators like polyimide (PI) and polyphthalamide (PPA). In other embodiments the submount 32 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. As more fully described below, LED packages according to the present invention can be fabricated using a method that utilizes a submount panel sized to accommodate a plurality of submounts. Multiple LED packages can be formed on the panel, with the individual packages being singulated from the panel.

The submount 32 has a top surface 40 comprising patterned conductive features that can include a die attach pad 42 with an integral first contact pad 44. A second contact pad 46 is also included on the submount's top surface 40 with the LED 34 mounted approximately at the center of the attach pad 42. These patterned conductive features provide conductive paths for electrical connection to the LED 34 using known contacting methods. The LED can be mounted to the attach pad 42 using known methods and material mounting such as using conventional solder materials that may or may not contain a flux material or dispensed polymeric materials that may be thermally and electrically conductive.

The size of the submount 32 in package 30 can vary depending on different factors, with one being the size of the LED. For example, the size of the package 30 can be essentially of the same dimension as the effective heat spreading area in the attach pad, and first and second contact pads 42, 44, and 46. In a package having a 1 mm LED, the submount can be approximately 3.5 mm by 3.5 mm; with a package having a 0.7 mm chip it can be 3.2 mm by 3.2 mm and generally of square shape in both cases. It is further understood that the submount can have other shapes including circular, rectangular or other multiple sided shapes.

The attach pad 42 and first and second contact pads 44, 46 can comprise much different material such as metals or other conductive materials. In one embodiment the pads 42, 44, 46 comprise copper deposited using known techniques such as plating. In typical plating process a titanium adhesion layer and copper seed layer are sequentially sputtered onto a substrate. Then, approximately 75 microns of copper is plated onto the copper seed layer. The resulting copper layer being deposited can then be patterned using standard lithographic processes. In other embodiments the layer can be sputtered using a mask to form the desired pattern.

In some embodiments according to the present invention some of the conductive features can include only copper, with others of the features including additional materials. For example, the attach pad 42 can be plated or coated with additional metals or materials to the make the attach pad 42 more suitable for mounting an LED 34. For example, the attach pad 42 can be plated with adhesive or bonding materials, or reflective and barrier layers.

A gap 48 (best shown in FIGS. 2a and 2d) is included between the second pad 46 and the attach pad 42 down to the surface of the submount 32 that, with the gap providing electrical isolation between the attach pad 42 and second pad 46. As more further described below, an electrical signal is applied to the LED 34 through the second pad 46 and the first pad 44, with the electrical signal on the first pad 44 passing directly to the LED 34 through the attach pad 42 and the signal from the second pad passing into the LED 34 through wire bonds. The gap 48 provides electrical isolation between the second pad 46 and attach pad to prevent shorting of the signal applied to the LED 34.

In some embodiments an electrical signal can be applied to the package 30 by providing external electrical contact to the first and second bond pads 44, 46 such as by solder contacts or other conductive paths to a PCB. In the embodiment shown the LED package 30 is arranged for mounting using surface mount technology and having internal conductive paths. The LED 30 comprises first and second surface mount pads 50, 52 (best shown in FIGS. 2c and 2e) that can be formed on the submount's back surface 54, at least partially in alignment with the first and second contact pads 44, 46, respectfully. Conductive vias 56 are formed through the submount 32 between the first mounting pad 50 and the first contact pad 44, such that when a signal is applied to the first mounting pad 50 is conducted to first contact pad 44. Similarly, conductive vias 56 are formed between the second mounting pad 52 and second contact pad 46 to conduct an electrical signal between the two. The first and second mounting pads 50, 52 allow for surface mounting of the LED package 30 with the electrical signal to be applied to the LED 34 applied across the first and second mounting pads 50, 52. The vias 56 and mounting pads 50,52 can made of many different materials deposited using different techniques, such as those used for the attach and contact pads 42, 44, 46.

It is understood that the mounting pads 50, 52 and vias 56 can be arranged in many different ways and can have many different shapes and sizes. It is also understood that instead of vias, one or more conductive traces can be provided on the surface of the submount between the mounting pads and contact pads, such as along the side surface of the submount.

A solder mask 58 made of conventional materials can be included on the submount's top surface 40, at least partially covering the attach pad 42 and the first and second contact pads 44, 46, and at least partially covering the gap 48. The solder mask 58 protects these features during subsequent processing steps and in particular mounting the LED 34 to the attach pad 42 and wire bonding. During these steps there can be a danger of solder or other materials depositing in undesired areas, which can result in damage to the areas or result in electrical shorting. The solder mask serves as an insulating and protective material that can reduce or prevent these dangers. The solder mask comprises an opening for mounting the LED 34 to the attach pad 42 and for attaching wire bonds to the second contact pad 46. It also comprises side openings 60 to allow convenient electrical access to the contact pads 44, 46 for testing the package 30 during fabrication. The solder mask 58 also has alignment holes that provide for alignment during fabrication of the package 30 and also allow for alignment when mounted in place by the end user.

In some embodiments the solder mask can be provided with a symbol or indicator 69 to illustrate which side of the LED package 30 should be coupled to the plus or minus of the signal to be applied to the package. This can ensure accurate mounting of the LED package 30 to a PCB or other fixture, whether by machine or hand. In the embodiment shown the symbol 69 comprises a plus (+) sign over the first contact pad 44, indicating that the package 30 should be mounted with the positive of the signal coupled to the first mounting pad 50. The minus of the signal would then be coupled to the second mounting pad 52. It is understood that many different symbol types can be used and that a symbol can also be included over the second conductive pad 46. It is also understood that the symbols can be placed in other locations other than the solder mask 58.

The package 30 can also comprise elements to protect against damage from electrostatic discharge (ESD). In the embodiment shown the elements are on-chip, and different elements can be used such as various vertical silicon (Si) Zener diodes, different LEDs arranged in parallel and reverse biased to the LED 34, surface mount varistors and lateral Si diodes. In the embodiment shown a Zener diode 62 is utilized and is mounted to the attach pad 42 using known mounting techniques. The diode is relatively small so that it does not cover an excessive area on the surface of the submount 32.

It is noted that the solder mask 58 includes and opening for the ESD diode 62 so that it can be mounted to the attach pad 42. Different mounting materials and methods can be used such as those used to mount the LED 34 to the attach pad 42. An ESD wire bond 64 is included between the second contact pad 46 at the solder mask opening and the ESD diode 62. Two LED wire bonds 65 are also included between the solder mask opening in the second contact pad 46 and wire bond pads 38 on the LED 34. In other embodiments only one wire bond can be included between the LED 34 and second contact pad. This LED 34 and ESD diode 62 arrangement allows excessive voltage and/or current passing through the LED package 30 from an ESD event to pass through the diode 62 instead of the LED 34, protecting the LED 34 from damage. The wire bonds 64 and 65 can be applied using known methods and can comprise known conductive materials, with a suitable material being gold (Au). It is understood that in other embodiments of an LED package according to the present invention can be provided without an ESD element/diode or with an ESD element/diode that is external to the LED package 30.

As mentioned above, heat typically does not spread efficiently into the submount 32, particularly those made of materials such as ceramic. When an LED is provided on an attach pad that extends generally only under the LED, heat does not spread through most of the submount, and is generally concentrated to the area just below the LED. This can cause overheating of the LED which can limit the operating power level for the LED package.

To improve heat dissipation in the LED package 30 the pads 42, 44, 46 provide extending thermally conductive paths to laterally conduct heat away from the LED 34 such that it can spread to other areas of the submount beyond the areas just below the LED 34. The attach pad 42 covers more of the surface of the submount 32 than the LED 34, with the attach pad extending from the edges of the LED 34 toward the edges of the submount 32. In the embodiment shown, the attach pad 42 is generally circular and extending radially from LED 34 toward the edges of the submount 32. A portion of the attach pad 42 intersects with the first and second contact pads 44, 46, with the gap 48 separating part of the attach pad adjacent to the second contact pad 46. It is understood that the contact pad 42 can be many other shapes and in some embodiments it can extend to the edge of the submount 32.

The contact pads 44, 46 also cover the surface of the submount 32 extending out from the vias, and covering the area between the vias 56, and the area between the vias 56 and the edges of the submount 32. By extending the pads 42, 44 and 46 this way, the heat spreading from the LED 34 is improved. This improves thermal dissipation of heat generated in the LED 34, which improves its operating life and allows for higher operating power. The pads 42, 44, and 46 can cover different percentages of the top surface 40 of the submount 32, with a typical coverage area being greater than 50%. In the LED package 30, the pads 42, 44 and 46 can cover approximately 70% of the submount. In other embodiments the coverage area can be greater than 75%.

The LED package 30 can further comprise a metallized area 66 on the back surface 54 of the submount, between the first and second mounting pads 50, 52. The metallized area is preferably made of a heat conductive material and is preferably in at least partial vertical alignment with the LED 34. In one embodiment, the metallized area is not in electrical contact with the elements on top surface of the submount 32 or the first and second mounting pads on the back surface of the submount 32. Although heat from the LED is laterally spread over the top surface of the submount by the attach pad 42 and the pads 44, 46 more heat will pass into the submount 32 directly below and around the LED 34. The metallized area can assist with this dissipation by allowing this heat to spread into the metallized area where it can dissipate more readily. It is also noted that the heat can conduct from the top surface of the submount 32, through the vias 56, where the heat can spread into the first and second mounting pads 50, 52 where it can also dissipate. For the package 30 used in surface mounting, the thickness of the metallized area 66 (best shown in FIGS. 2c and 2e) and the first and second pads 50, 52 should be approximately the same such that all three make contact to a lateral surface such as a PCB.

Three solder dams 67 can be included around the area of the attach pad 42 for mounting of the LED 34, with the solder dams serving to help center the LED and to reduce movement of the LED from the mounting area during while the mounting solder is in liquid form. When the liquid solder encounters any one of the dams, movement is slowed or stopped. This helps reduce the movement of the LED until the solder hardens.

An optical element or lens 70 is formed on the top surface 40 of the submount 32, over the LED 34, to provide both environmental and/or mechanical protection. The lens 70 can be in different locations on the top surface 40 with the lens located as shown with the LED 34 at approximately the center of the lens base. In some embodiments the lens can be formed in direct contact with the LED 34 and the submount's top surface 40. In other embodiments there may be an intervening material or layer between the LED 34 and/or top surface 40. Direct contact to the LED 34 provides certain advantages such as improved light extraction and ease of fabricating.

As further described below, the lens 70 can be molded using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 70 can also be textured to improve light extraction or can contain materials such as phosphors or scattering particles.

The LED package 30 can also comprise a protective layer 74 covering the submount's top surface 40 between the lens 70 and edge of the submount 32. The layer 74 provides additional protection to the elements on the top surface to reduce damage and contamination during subsequent processing steps and use. Protective layer 74 can be formed during formation of the lens 70 and can comprise the same material as the lens 70. It is understood, however, that the LED package 30 can also be provided without the protective layer 74.

The lens 70 should also be able to withstand certain sheer forces before being displaced from the submount 32. In one embodiment, the lens can withstand a 1 kilogram (kg) or more sheer force. In embodiments of the LED package using silicones that are harder after curing and have a higher durometer reading, such as Shore A 70 or higher, tend to better withstand sheer forces. Properties such as high adhesion and high tensile strength may also contribute to the ability of the lens to withstand sheer forces.

The lens arrangement of the LED package 30 is also easily adapted for use with secondary lens or optics that can be includes over the lens by the end user to facilitate beam shaping. These secondary lenses are generally known in the art, with many of them being commercially available.

FIGS. 3a to 3e show another embodiment of an LED package 100 according to the present invention having similar features to those in LED package 30. For similar features the same reference numbers are used herein and in FIGS. 4a and 4b below with the understanding that the description above applies equally to this embodiment. The LED package 100 comprises a submount 32, and LED 34, a lens 70 and wire bonds 64 and 65. Like the LED package 30, LED package 100 is arranged for surface mounting but has a different arrangement for its conductive pads that provides for contacting at one side of the submount 32.

The LED package comprises an attach pad 102 with an integral first contact pad 104, separated by a gap 108 from a second contact pad 106. A gap 108 provides electrical isolation as described above. The LED 34 is mounted to the attach pad using the methods described above, and the wire bond 65 runs between the second contact pad 106 to conduct the electrical signal at the second contact pad 106 to the LED 34. The first and second contact pads 104, 106 are not on opposite sides of the submount 32, but are instead on the same side. The attach pad 102 covers most of the submount's top surface 40 to provide improved heat spreading as described above. The first and second contact pads 104, 106 also cover portions of the top surface to assist in current spreading.

First and second surface mount contact 110, 112 are included on the submount's back surface 54, at least in partial vertical alignment with the first and second contact pads 104, 106, respectively. Conductive vias 114 run through the submount between the first surface mount contact 110 and the first contact pad 104, and the second surface mount contact 112 and the second contact pad 106, so that an electrical signal on the surface mount contacts 110, 112 is conducted through the vias to the contact pads 104, 106. The signal is then conducted to the LED 34. The LED package 100 also comprises a metallized area 116 to further improve heat spreading from the LED 34 and submount 32. The metallized area 116, however, is not between the surface mount contacts 110, 112 but covers an area of the back surface 54 opposite them.

The LED package 100 as shown does not have a protective layer covering the submount's top surface 40 between the edge of the lens 70 and the edge of the top surface 40, although such a protective layer can be included in other embodiments. The LED package 100 can also be provided with an ESD protection element 62 and solder mask 58 as described above. The LED package 100 provides for improved thermal management as in LED package 30, but allows for surface mount contacting along one side of the submount instead of opposite sides. The LED package can also include symbols 118 to assist in alignment by the end user.

Figure 4A:
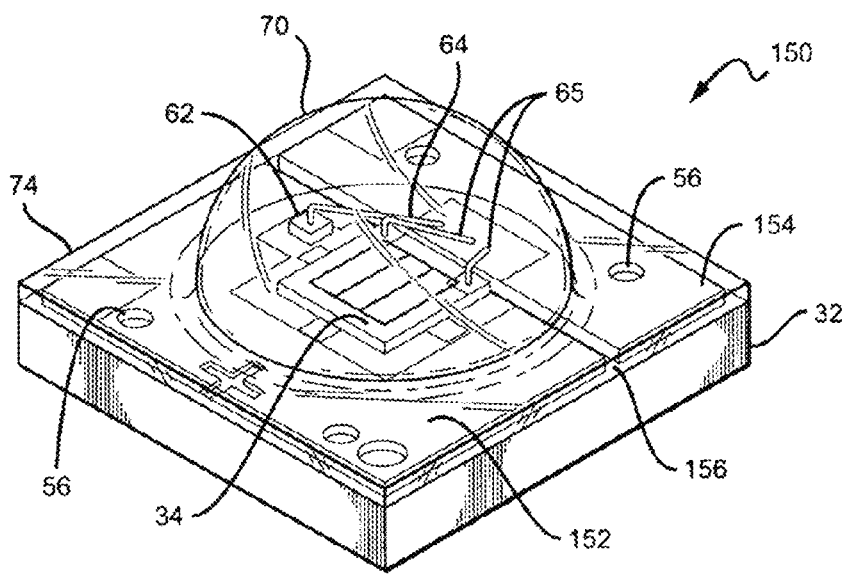
FIG. 4a is an upper perspective view of another embodiment of an LED package according to the present invention.
Figure 4B:
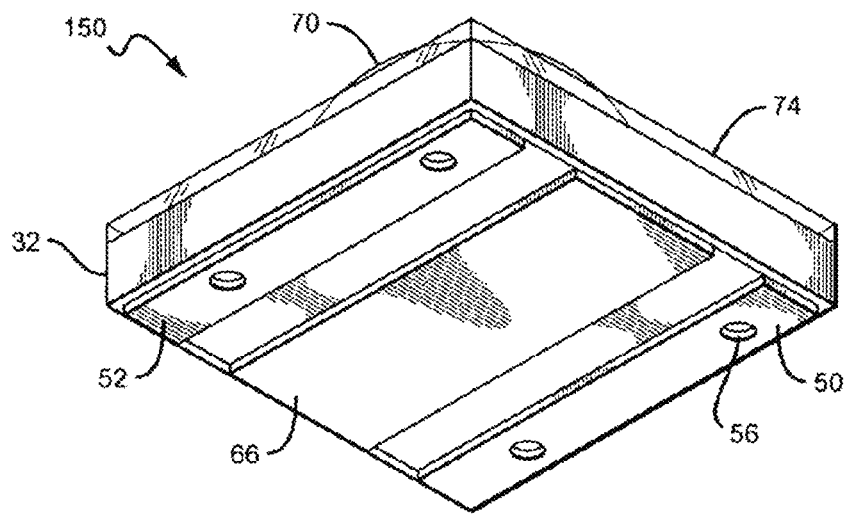

FIGS. 4a and 4b show still another embodiment of an LED package 150 according to the present invention generally comprising a submount 32, LED 34, first and second contact pads 50, 52, vias 56, ESD diode 62, wire bonds 64, 65, metallized area 66, lens 70 and protective layer 74. In this embodiment, however, the attach pad is not circular, but in combination with the first contact pad, comprises a rectangular shaped first conductive layer 152 on and covering the majority the submount 32. Vias 56 run between the first layer 152 and the first contact pad 50 on one side of the first layer 152, with the LED and ESD diode mounted to a attach pad area on the opposing side.

A second conductive layer 154 covers most of the remainder of the submount's top surface, with a gap 156 between the first and second layers 152, 154. Vias 56 run between the second layer 154 and the second contact pad 52, with the wire bonds 64, 65 running between the second layer 154 and the LED 43 and ESD diode 62. Like the embodiments above, an electrical signal applied to the first and second contact pads 50, 52 is conducted to the LED 34, causing it to emit light.

In this embodiment, the first and second layers 152, 154 cover substantially all of the submount's top surface, providing the capability for broad lateral heat spreading from the LED 34. This arrangement, however, presents a minimal pattern for pattern recognition during assembly. By comparison, the shaped pad arrangement shown in FIGS. 2a-2g provides for greater pattern recognition for assembly, while at the same time providing suitable lateral current spreading.

Figure 5:
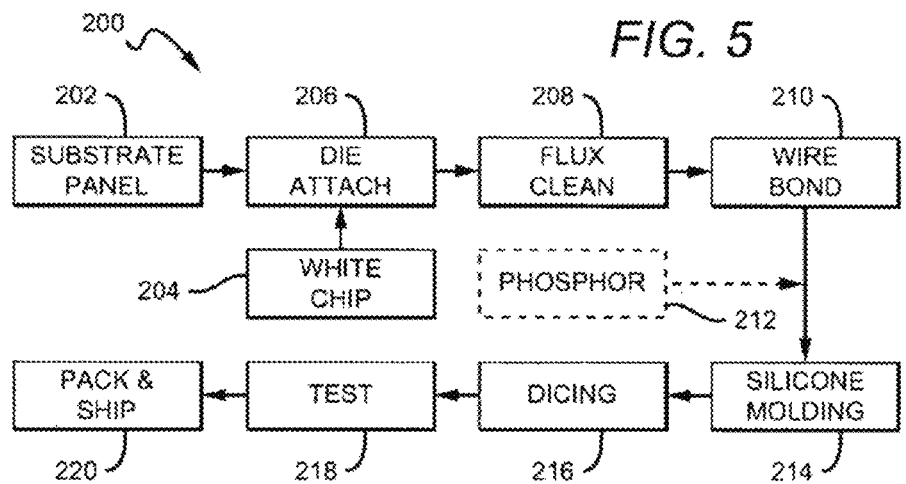
FIG. 5 is a flow diagram for one embodiment of a fabrication method according to the present invention.

The present invention also provides for improved methods for fabricating LED packages wherein multiple packages can be fabricated simultaneously. This reduces cost and complexity in fabrication, and allows for fabrication of devices with controlled features and emission characteristics. FIG. 5 shows one embodiment of an LED package fabrication method 200 according to the present invention. In 202 a substrate (submount) panel that can be diced in subsequent manufacturing steps to provide a plurality of individual submounts. A panel is provided to allow for the simultaneous fabrication of a plurality of packages. It is understood that a separate processing step is required for providing the LED package conductive features on the panel. These features can include the attach pad, contact pads, surface mount pads, vias and metallized area, all of which can be arranged to assist in dissipating heat generated by the LED. The panel will comprise a plurality of these features arranged in sets, each of the sets corresponding to one of the plurality of packages to be formed from the panel. Many different panel sizes can be used such as for example, 3 inches by 4 inches, 2 inches by 4 inches, and 4 inches by 4 inches.

In 204 a plurality of LEDs are provided, each of which is to be mounted to a respective one of the attach pads on the substrate panel. In one embodiment, the plurality of LEDs comprise white emitting LEDs chips, and many different white chips can be used with a suitable white chip being described in the patent applications mentioned above and incorporated herein. In other embodiments more than one LED can be provided for mounting to each of the attach pads. In this step a plurality of ESD protection elements can also be provided, each of which can be mounted in conjunction with one of the attach pads to provide ESD protection for its LED package.

In 206 each of the LEDs is die attached to the one of the attach pads, and as mentioned above, many different mounting methods and materials can be used, with a suitable method being mounting using conventional solder materials and methods. In this step each of the ESD elements can also be mounted to a respective attach pad using the same mounting method and material. It is understood that the ESD element can also be mounted in other locations using other methods.

In 208 the panel undergoes a solder flux clean to remove any flux that may have accumulated during previous processing steps. In 210 wire bonds are formed on the contact pads for each of the LEDs and ESD elements electrically connecting them to the appropriate one of their respective contact pads. As described above, each of the LEDs and their accompanying ESD element can be wire bonded to the second contact pad. The wire bonds can be formed using known processes and can be made of known conductive materials such as gold.

In some embodiments the LEDs can be provided and mounted to the panel without the desired conversion material. In these embodiments the conversion material can be deposited on the LED after wire bonding. In optional 212 the conversion material or phosphor is deposited on the LED and many different known phosphor deposition methods can be used such as electrophoretic deposition or EPD. Many different phosphor deposition processes can be used with a suitable EPD process described in the patent application described above.

Figure 6A:
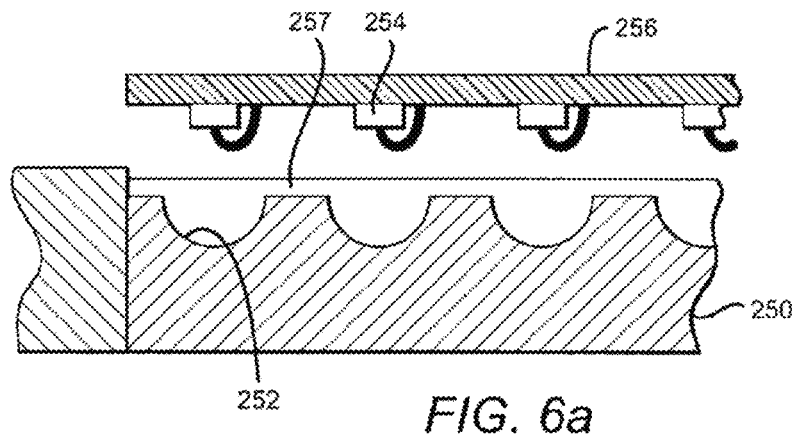
FIG. 6a is a sectional view of one embodiment of a lens mold according to the present invention.
Figure 6B:
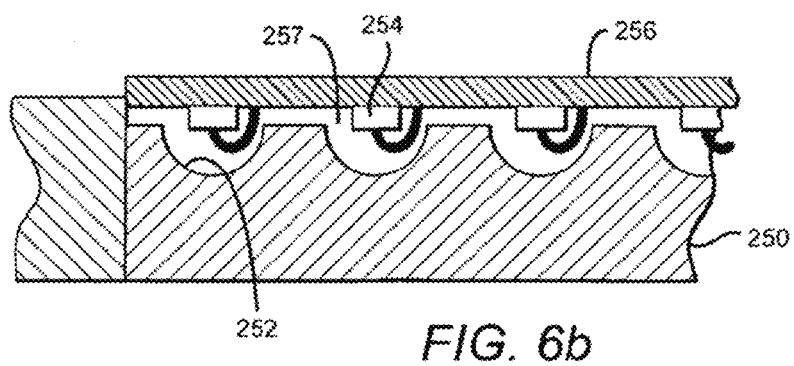
Figure 7A:
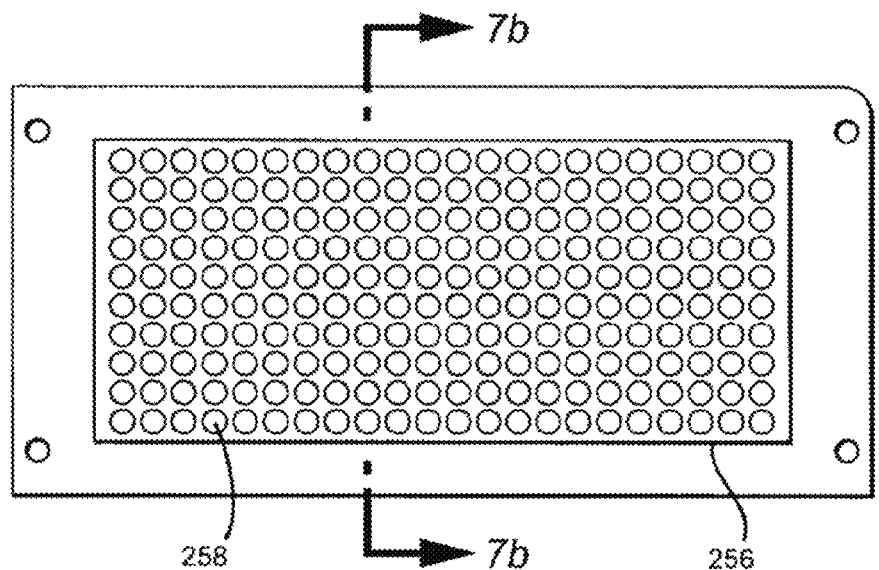
FIG. 7a is a plan view of one embodiment of a submount panel with lenses arranged according to the present invention.
Figure 7B:
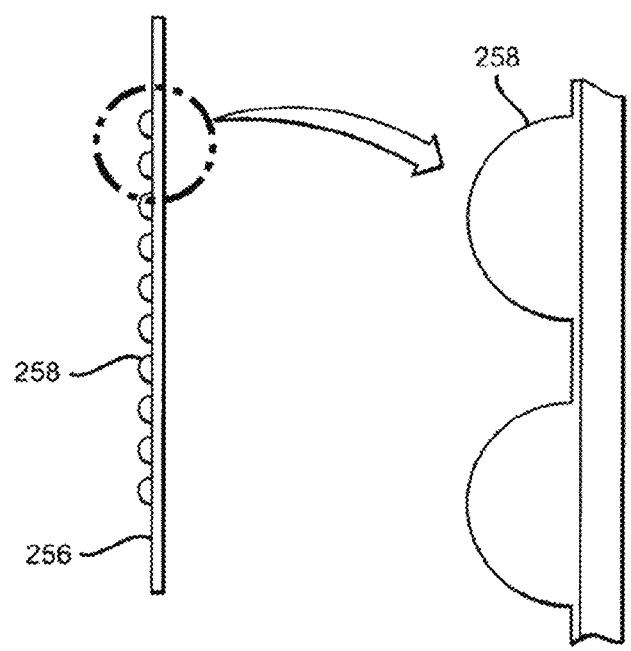
FIG. 7b is a sectional view of the submount panel taken in FIG. 7a taken along section lines 7b-7b.

In 214 a lens is molded over each of the LEDs and many different molding methods can be used. In one embodiment a molding process is used that simultaneously forms lenses over the LEDs in the submount panel. One such molding process is referred to as compression molding processes. Referring now to FIGS. 6a and 6b one embodiment of compression molding is shown wherein a mold 250 is provided having a plurality of cavities 252 each of which has an inverted shape of the lens, wherein each cavity 252 is arranged to align with a respective one of the LEDs 254 on a substrate panel 256. The mold 250 is loaded with a lens material 257 in liquid form filling the cavities 252, with the preferred material being liquid curable silicone. Referring to FIG. 5b, the panel 256 is moved toward the cavity with each of the LEDs 254 being embedded in the liquid silicone within one a respective one of the cavities 252. In one embodiment a layer of silicone can also remain between adjacent lenses that provides a protective layer over the top surface of the submount. The liquid silicone can then be cured using known curing processes. The panel can then be removed from the mold and as shown in FIGS. 7a and 7b the panel can comprise a plurality of lenses 258, each of which is over a respective one of the LEDs 254. The individual LED packages can then be separated from the panel, such as along dashed lines shown.

Referring again to FIG. 5, in 216 the panel can then diced/singulated to separate the individual LED packages and different methods can be used such as known saw singulation methods. When using this method a tape can be attached to the panel prior to singulation to hold and stabilize the panel and individual LED packages. Following singulation, the LED packages can be cleaned and dried.

In 218 each of the LED packages can be tested to be sure they are operating correctly and to measure each device output light characteristics. It is understood that the packages can also be tested at different points in this method by probing the submount panel. In 220 the LED packages can be binned according to their output characteristics, packaged according to each bin, and shipped to the customer.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

FIG. 8 is a top-down view of a submount 350 for an LED device according to example embodiments of the invention. Submount 350 of FIG. 8 includes a rigid base 352 that, as an example, can be made of a ceramic material such as alumina or aluminum nitride. Submount 350 also includes a patterned metal layer shaped to provide connectivity to LED chips fixed to the submount. Metal layer portion 354 is for connection to the anodes of the LED chips fixed to the submount, and metal layer portion 356 is for connection to the cathodes of said LED chips. The metal layer can be initially deposited on the ceramic base and then etched to form the desired pattern, can be formed and fixed to the base with adhesive, or produced in any other suitable fashion. The metal layer can include various holes and notches for alignment during manufacturing, visible identification and the like, such as connection points 358 for connecting wires from the positive side of the power source to the LED device and connection points 359 for connecting wires from the negative side of the power source to the LED device. Connection points may be formed of additional metal or solder deposited on the metal layer.

FIG. 9 is a top-down view of an LED device 340 according to example embodiments of the invention. LED device 340 makes use of submount 350 as described in FIG. 8. LED device 340 includes a plurality of interconnected LED chips 342 fastened to metal layer portion 354 of the submount. In this particular example, four LED chips are used. The anodes of the LED chips are on the bottom of the chips in this view and are in contact with metal layer portion 354, which is in turn connected to the positive terminal of a power source supplying current to the LED chips. The cathodes of the LED chips are connected by wire bonds 344 to metal layer portion 356, which is in turn connected to the negative terminal of the power source. Thus, in this example embodiment, the four LED chips are connected in parallel.

Staying with FIG. 9, LED device 340 includes an electrostatic discharge (ESD) protection chip 346, also fastened to metal layer portion 354. ESD chip 346 is connected with a wire bond to metal layer portion 356. It should also be noted that the wire bonds 344 connected between an LED chips and the submount are arranged so that all the wire bonds are disposed on the outside of the group of four LED chips used in LED device 340. This arrangement allows the plurality of LED chips to be placed close together and be relatively small but still have relatively high efficiency and output. Additionally, four chips can be combined in various color combinations to achieve a desired CRI, color temperature, or other color-related characteristic.

LED chips 342 and ESD chip 346 of FIG. 9 can be fastened to the submount with conductive adhesive, solder, a welding process, or in any of various other ways. The device is completed with an optical element, for example a lens, placed on top of the device and fastened in place to affect light from the LED chips. Both the lens and the distortion it would introduce when the device is viewed are omitted from FIG. 9 for clarity of illustration, but example lenses are illustrated later in connection with other embodiments of the invention. Both the term "optical element" and the term "lens" as used in this disclosure are intended in their broadest sense. Such an element may affect light by bending and/or concentrating light rays, by color mixing, or by a combination of these effects. A phosphor could also be used to provide wavelength conversion. A lens for use with an LED device of an embodiment of the invention may be made of glass or plastic, may be molded in place elsewhere, or otherwise formed or attached to the device as desired. For example, the lens may be molded in place from silicone. In example embodiments, a clearance is maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example with four LED chips, if the maximum width of the LED chips is 1.4 mm, the lens clearance is about 0.9 mm, or about 0.643 the maximum width of the LED chips.

LED chips 342 of FIG. 9 may be selected from various light color bins to provide a combined light output with a high color rendering index (CRI). The desired color mixing may be achieved, for example, using blue, green, amber, red and/or red-orange LED chips. One or more of the chips may be in a package with a phosphor or may otherwise have a locally applied phosphor. An example of selecting chips from various color bins to produce desired color characteristics is described in U.S. Patent Application 2010/0140633, published Jan. 10, 2010, which is incorporated herein by reference. A detailed example of using groups of LEDs emitting light of different wavelengths to produce substantially white light can be found in issued U.S. Pat. No. 7,213,940, which is incorporated herein by reference.

In some example embodiments, the lens for an LED device such as LED device 340 of FIG. 9 may be less than 5 mm in diameter or less than 4 mm in diameter. In some embodiments the lens may be about 3.1 mm in diameter and may include LED chips of about 700 microns in size, meaning the chips are about 700 microns wide on a side. The chips may be about or less than 1000 microns in size, about or less than 700 microns in size, about or less than 500 microns in size, or about or less than 300 microns in size. An LED device like that shown in FIG. 9 may have an efficiency of at least 80 lumens/Watt (lm/W) and a CRI of at least 80. The LED device may have an efficiency of at least 89 lm/W and a CRI of at least 82. The design of the LED device can be adapted so that various types of LED chips could be used, such as direct-bond chips, flip-chips, and chips with substrates made of sapphire, silicon carbide, silicon or other materials.

Figure 1A:
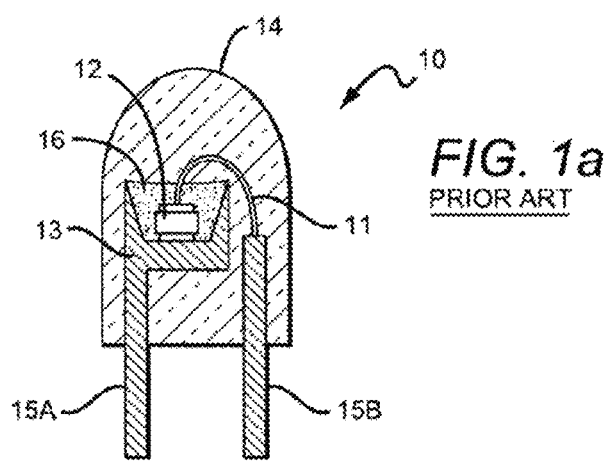
FIG. 1a is a sectional view of a prior art LED package.
Figure 1B:
FIG. 1b is a sectional view of another prior art LED package.
Figure 2G:
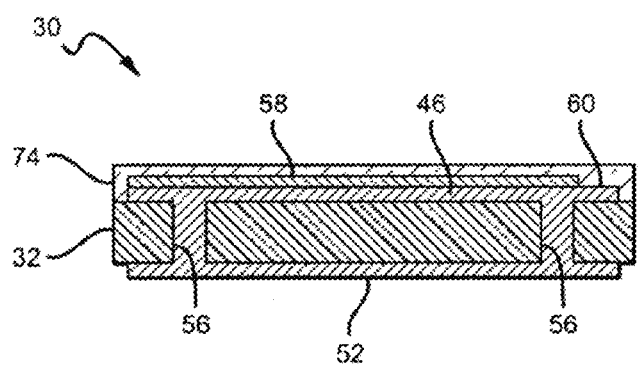
FIG. 2g is a sectional view of the LED package shown in FIG. 2a, taken along section lines 2g-2g.
Figure 2A:
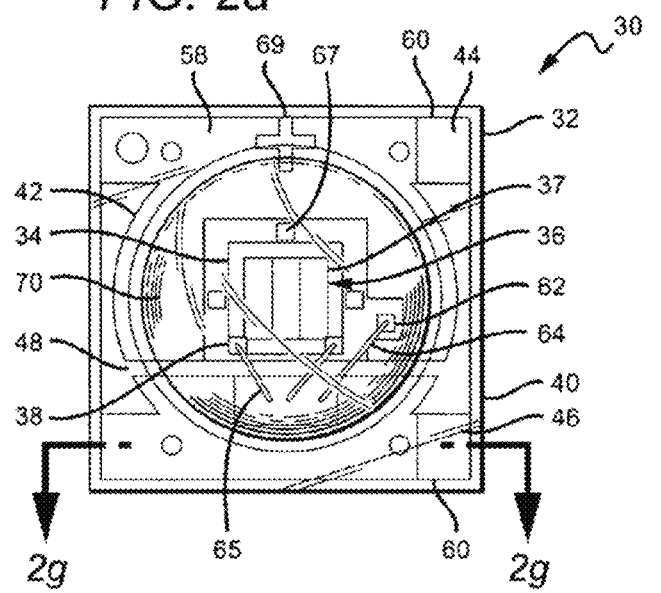
FIG. 2a is a top view of one embodiment of an LED package according to the present invention.
Figure 2B:
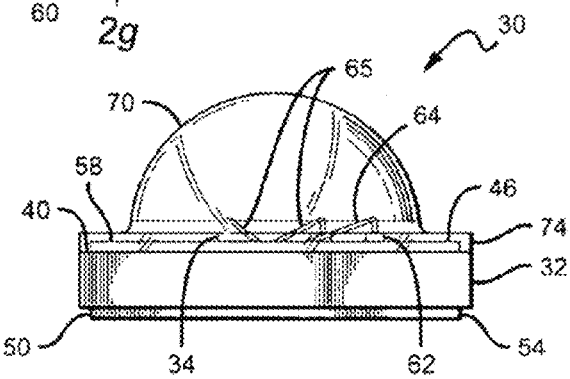
Figure 2C:
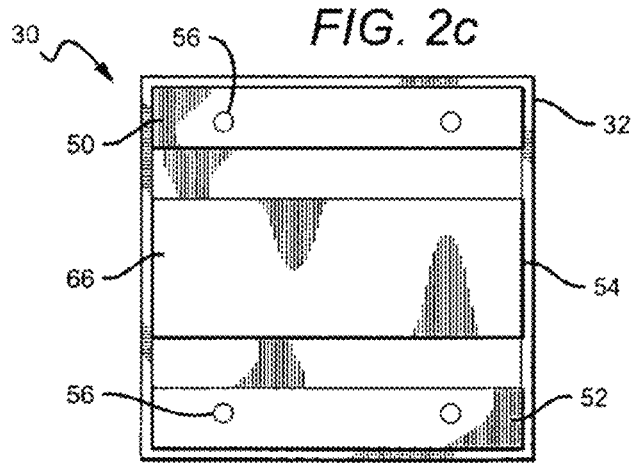
Figures 2D, 2E:
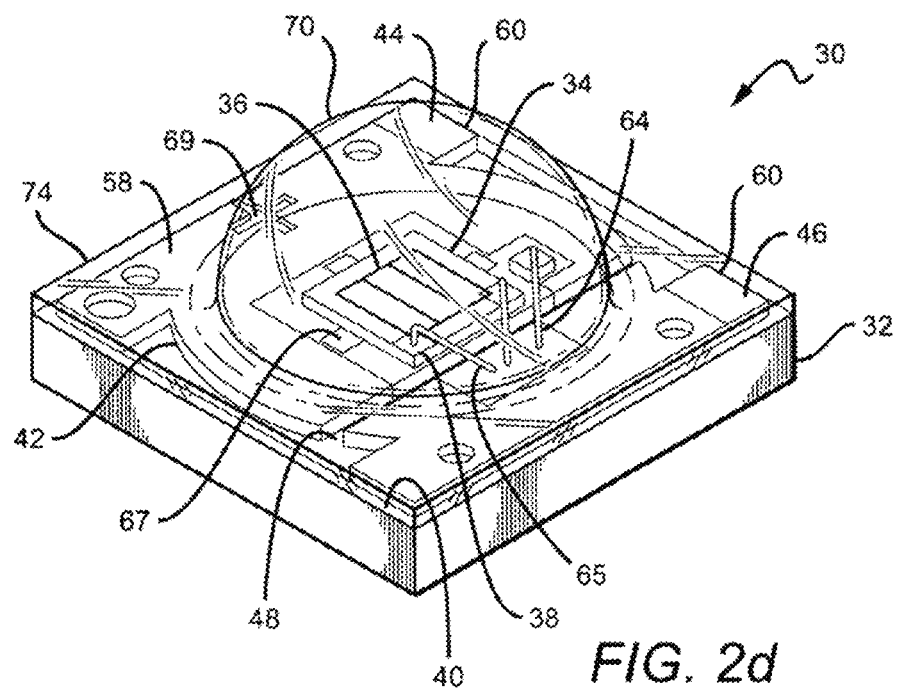
Figure 2F:
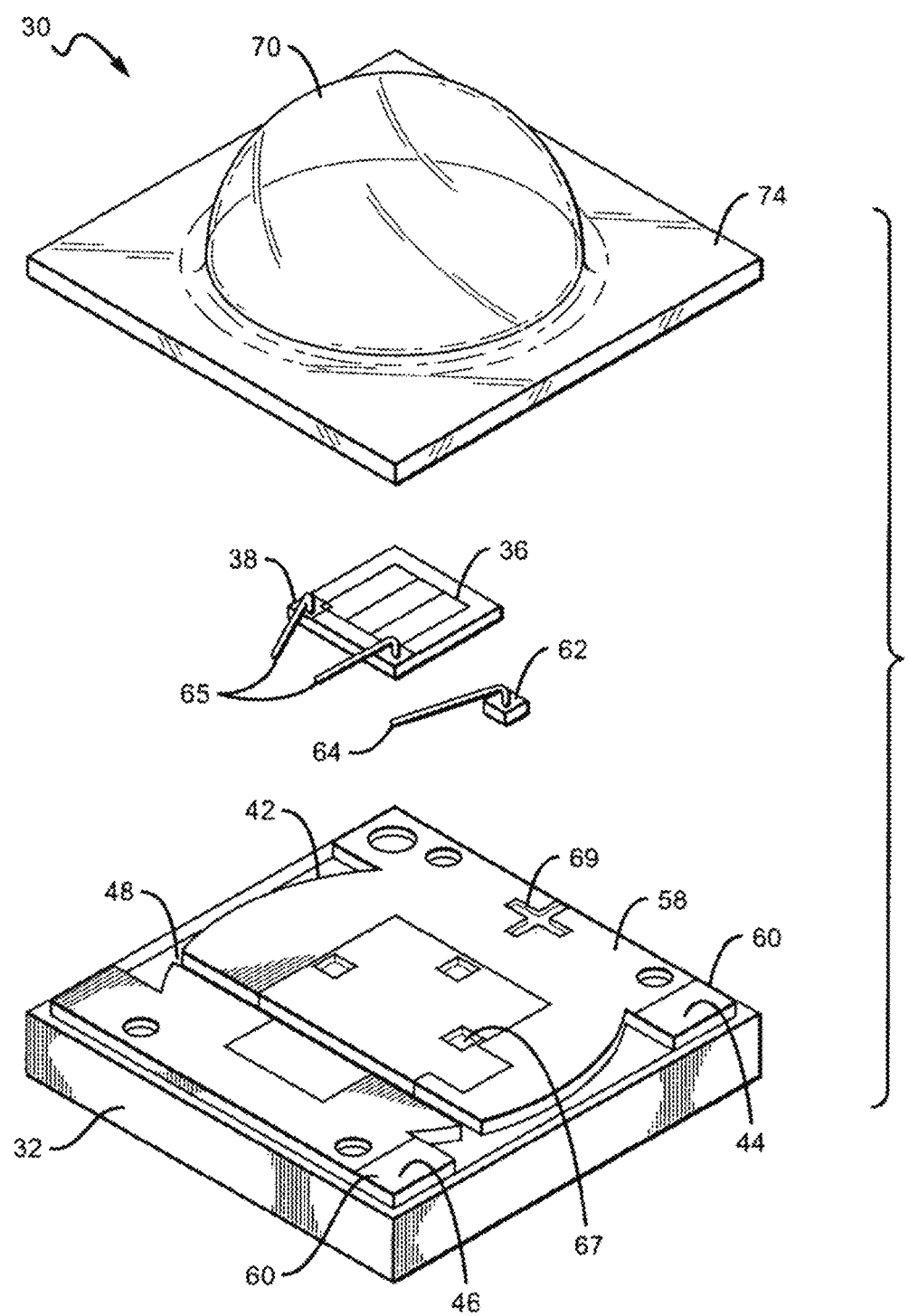
Figure 3D:
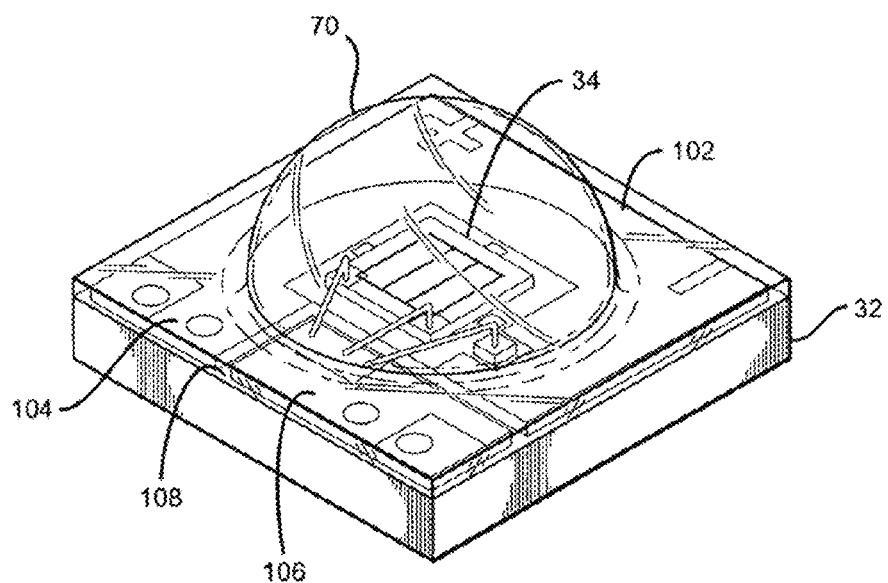
Figure 3E:
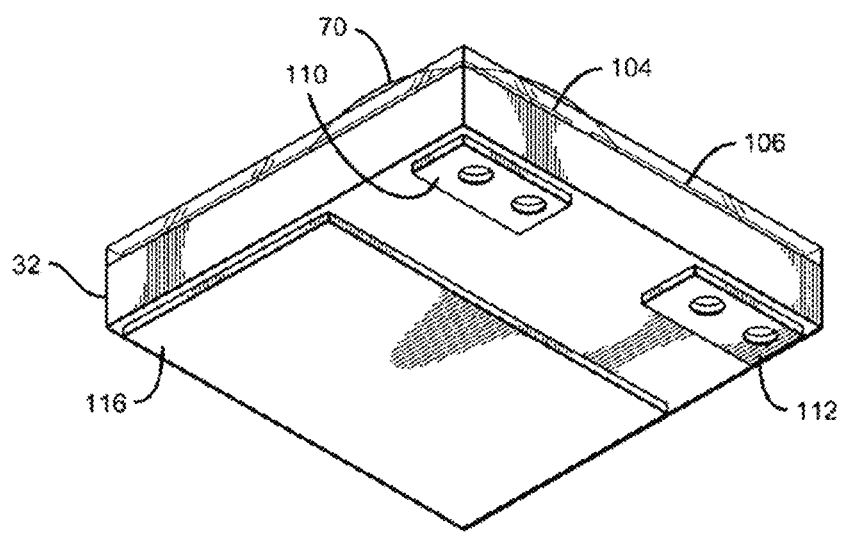

FIG. 10 is a top-down view of an LED device 330 according to some example embodiments of the invention. LED device 330 again makes use of submount 350 as described in FIG. 1. LED device 330 includes a plurality of interconnected LED chips 332 fastened to metal layer portion 354 of the submount. In this example, the LED chips are so-called "sideview" LEDs, for each of which the connection points for both the anode and cathode are on top. The anodes of the LED chips are connected to metal layer portion 354 with wire bonds 334, and the cathodes of the LED chips are connected by wire bonds 335 to metal layer portion 356. In this example embodiment, the four LED chips are again connected in parallel.

Staying with FIG. 10, LED device 330 includes an electrostatic discharge (ESD) protection chip 336, fastened to metal layer portion 354. ESD chip 336 is also connected with a wire bond to metal layer portion 356. It should also be noted that the wire bonds connected between the plurality of LED chips and the submount are arranged so that all the wire bonds tend to the outside of the group of four LED chips used in LED device 330 as much as possible. This arrangement again allows the LED chips to be placed close together. As before, the LED chips can be combined in various color combinations to achieve a desired CRI, color temperature, or other color-related characteristic.

LED chips 332 of FIG. 10 can be fastened to the submount with adhesive, or in any of various other ways. Since these sideview chips have both connections on top, the adhesive need not be conductive. As before, the device is completed with an optical element, for example a lens, placed on top of the device and fastened in place to affect light from the LED chips. Both the lens and the distortion it would introduce when the device is viewed are omitted from FIG. 10 for clarity of illustration, but example lenses are illustrated later in connection with other embodiments of the invention. Both the term "optical element" and the term "lens" as used in this disclosure are intended in their broadest sense. Such an element may affect light by bending and/or concentrating light rays, by color mixing, or by a combination of these effects. A phosphor could also be used to provide wavelength conversion. A lens for use with an LED device of an embodiment of the invention may be made of glass or plastic, may be molded in place or elsewhere, or otherwise formed or attached to the device as desired. For example, the lens may be molded in place from silicone. In example embodiments, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. LED chips 332 of FIG. 10 may again be selected from various light color bins to provide a combined light output with a high color rendering index (CRI). The desired color mixing may be achieved, for example, using blue, green, amber, red and/or red-orange LED chips. One or more of the chips may be in a package with a phosphor or may otherwise have a locally applied phosphor.

In some example embodiments, the lens for an LED device such as LED device 330 of FIG. 10 may be less than 5 mm in diameter or less than 4 mm in diameter. In some embodiments the lens may be about 3.1 mm in diameter. LED chips of various sizes and shapes may be used. A typical sideview chips has a rectangular top, angled sides, and a smaller, rectangular bottom. The sides of the rectangle can vary between about 100 and 500 microns, and the chip may have a thickness of 100 to 150 microns.

FIG. 11 is an electronic schematic diagram of the circuit of the LED devices from FIGS. 9 and 10. Circuit 400 includes four LEDs 402 connected in parallel to form a single group of LEDs. Current to illuminate the LEDs is supplied by power source 405. ESD protection device 406 is connected in parallel with the LEDs.

FIG. 12 is a top-down view of a submount 500, which can be used for various LED devices according to example embodiments of the invention. Submount 500 of FIG. 12 includes a rigid base 502 that, as an example, can be made of plastic, or as a further example can be made of a ceramic material such as alumina or aluminum nitride. Submount 500 includes a patterned metal layer shaped to provide connectivity to LED chips fixed to the submount. This patterned metal layer includes semicircular areas of metal to which LED chips can be bonded. Metal layer portion 504 is for connection to the anodes of one group of LED chips fixed to the submount, and metal layer portion 506 is for connection to the anodes of another group of LED chips. Metal layer portion 508 is for connection to some of the cathodes of LED chips in the first group of LED chips, and metal layer portion 510 is for connection to some of the cathodes in the other group of LED chips. Metal layer portion 510 is connected to protruding rail 512 and metal layer portions 506 and 508 are connected by interconnection rail 514. Rails 512 and 514 run near each other and form a centrally located connection bus, or more simply, a central bus to which wire bonds from some of the cathodes of the LED chips are connected. A central bus or central connection bus within the meaning of this disclosure is a part of the metal layer of a submount where portions to be connected to different LEDs or different terminals of the LEDs come close together to allow connections that enable relatively high chip-density. Such a central bus typically has one or more connection rails providing at least some of the connection portions. In this example, wire bonds from some of the cathodes of LED chips from the first group of LED chips are connected to rail 514 and wire bonds from some of the cathodes of LED chips in the additional group of LED chips are connected to rail 512.

The metal layer can be initially deposited on the base and then etched to form the desired pattern, can be formed and fixed to the base with adhesive, molded into a base, or produced in any other suitable fashion. The metal layer can include various holes and notches for alignment during manufacturing, visible identifications and the like, as well as connection points, such as connection points 520 for connecting wires from the positive side of the power source to the LED device and connection points 522 for connecting wires from the negative side of the power source to the LED device. Connection points may be formed of additional metal or solder deposited on the metal layer.

Figure 13:
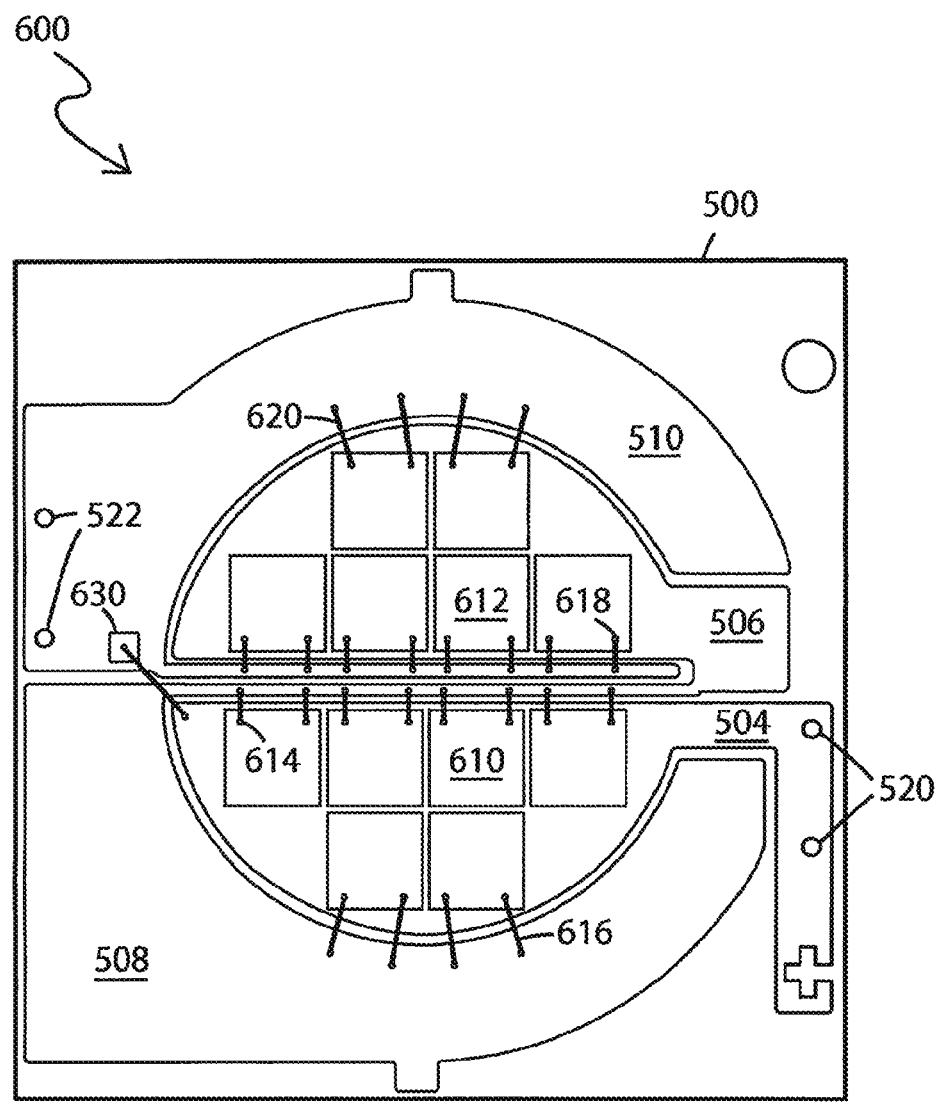

FIG. 13 is a top-down view of an LED device 600 according to some example embodiments of the invention. LED device 600 makes use of submount 500 as described in FIG. 12. LED device 600 includes twelve LED chips arranged in two groups. Six LED chips 610 are fastened to metal layer portion 504 of the submount and are connected in parallel. The anodes are on the bottom of the LED chips 610 and are in contact with metal layer portion 504, which is in turn connected to the positive terminal of a power source supplying current to the device via connection points 520. Six LED chips 612 are fastened to metal layer portion 506 of the submount and are also connected in parallel. The anodes of the LED chips 612 are in contact with metal layer portion 506.

Still referring to FIG. 13, the cathodes of all of the LED chips are connected by wire bonds to metal layer portions of submount 500 as follows. Wire bonds from the cathodes of LED chips 610 are connected to metal layer portions of the submount. More specifically, wire bonds 614 are connected to interconnection rail 514 of the central bus of submount 500, and wire bonds 616 are connected to metal layer portion 508 of the submount. Wire bonds from the cathodes of LED chips 612 are also connected to metal layer portions of the submount. More specifically, wire bonds 618 are connected to extension rail 512 of the central bus of submount 500, and wire bonds 620 are connected to metal layer portion 510 of the submount 500.

Staying with FIG. 13, LED device 600 includes an electrostatic discharge (ESD) protection chip 630, fastened to metal layer portion 510 and connected with a wire bond to metal layer portion 504. Metal layer portion 504 is connected to the positive terminal of a power source supplying current to the LED device. Metal layer portion 510 is connected to the negative terminal of a power source supplying current to the LED device. The wire bonds connected between the LED chips within each group of six LED chips in LED device 600 and the submount are arranged so that all the wire bonds in a group are disposed on the outside of the group of six LED chips, allowing the LED chips in a group to be placed close together and this density of the LED chips in a group allows LED device 600 to be relatively small but still have a relatively high efficiency and output. Also, the patterning of the metal layer portions of the submount together with the arrangement of wire bonds interconnects the LED chips within a group in parallel while the groups themselves are connected in series.

The LED chips and ESD chip of LED device 600 of FIG. 13 can be fastened to the submount with conductive adhesive, solder, a welding process, or in any of various other ways. As before, the device is completed with an optical element placed on top of the device to affect light from the LED chips.

Both the optical element and the distortion it would introduce when the device is viewed are omitted in FIG. 13 for clarity of illustration, but an example lens is discussed later with respect to FIG. 21. Again, an optical element, for example, a lens, may affect light by bending and/or concentrating light rays, by color mixing, or by a combination of these effects. A phosphor could also be used to provide wavelength conversion. A lens or other optical element for use with an LED device of embodiments of the invention may be made of glass or plastic, may be molded in place or elsewhere, or otherwise formed or attached to the device as desired. In example embodiments, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example, if the maximum width of the LED chips is 5.6 mm, the lens clearance is about 1.7 mm, or about 0.303 the maximum width of the LED chips.

As before, the LED chips in the device of FIG. 13 may be selected from various light color bins to provide a combined light output with a high CRI. In some example embodiments, the lens for an LED device such as LED device 600 of FIG. 13 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, chips of various sizes may be used. The chips may be about or less than 2000 microns in size, about or less than 1000 microns in size, about or less than 700 microns in size or about or less than 500 microns in size. Also, mixed chip sizes may be used in a single device. A specific example embodiment with mixed chip sizes is described later in this disclosure with respect to FIG. 16. An LED device like that shown in FIG. 13 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved. The design of the LED device of FIG. 13 can be adapted so that various types of LED chips could be used, such as direct-bond chips, flip-chips, and chips with substrates made of sapphire, silicon carbide, silicon or other materials.

Figure 14:
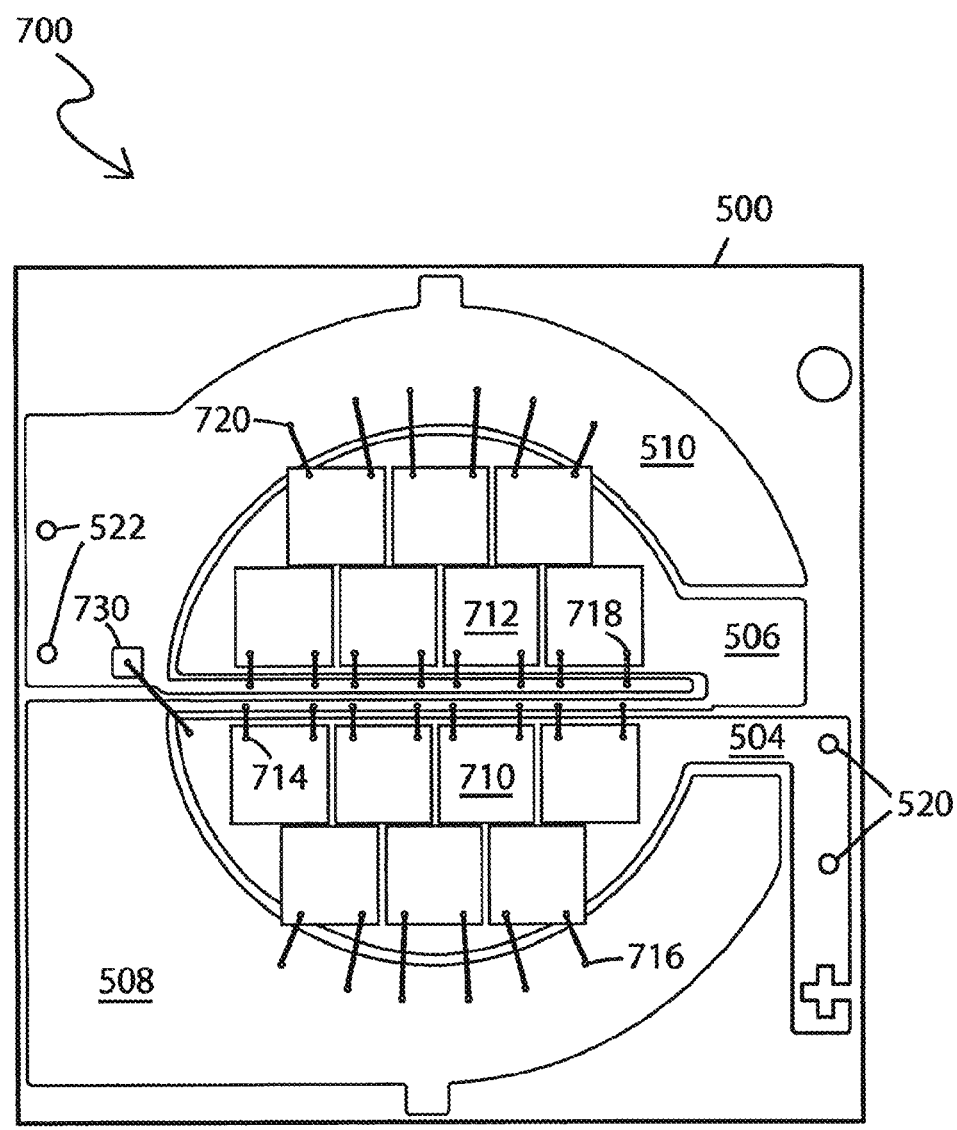
Figure 15:
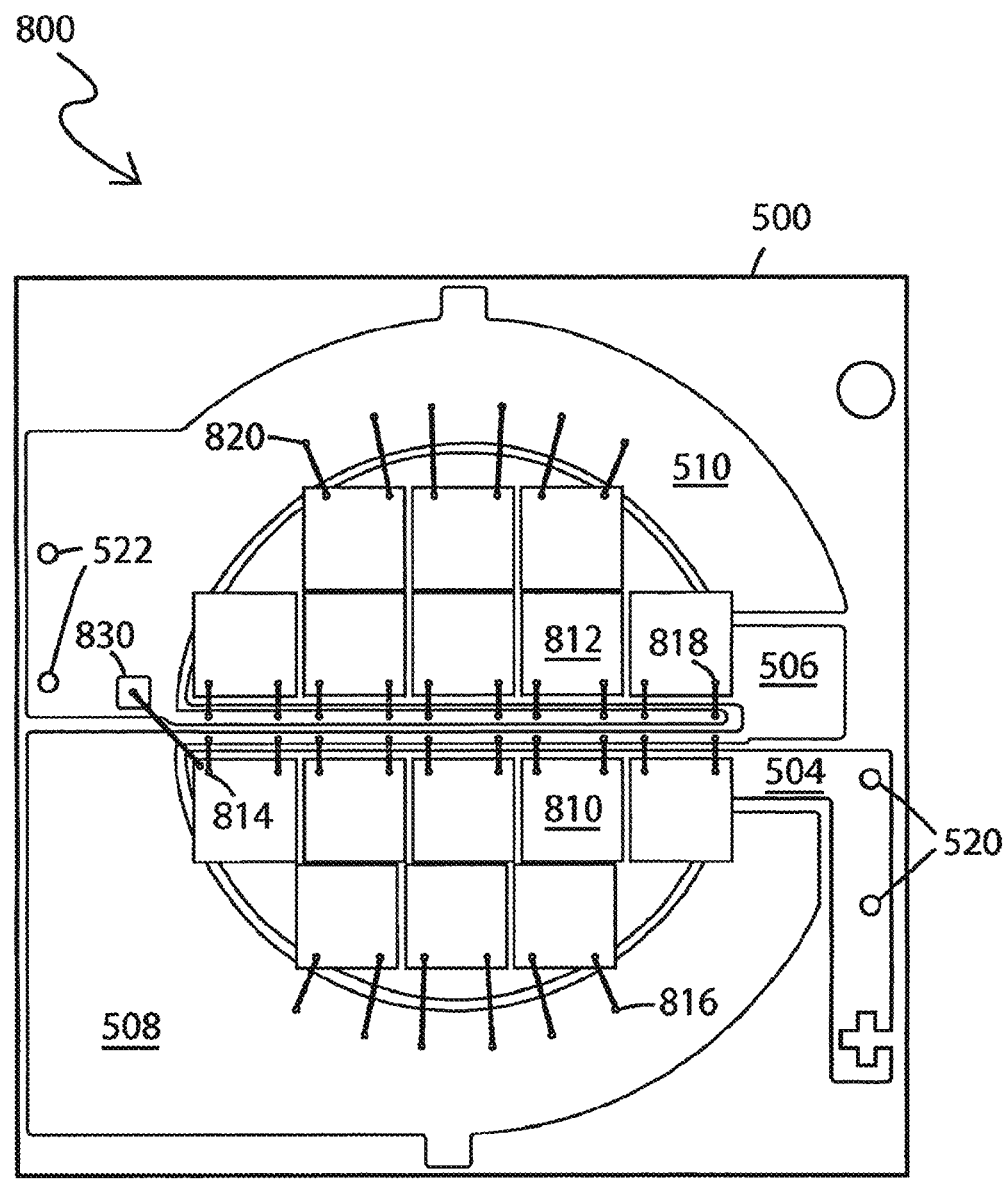

FIGS. 14 and 15 are top-down views of LED devices that are similar to the device shown in FIG. 13, but which include more LED chips in each group. FIG. 14 is a top-down view of an LED device 700 according to some example embodiments of the invention. LED device 700 makes use of submount 500 as previously described. LED device 700 includes fourteen LED chips arranged in two groups. Seven LED chips 710 are fastened to metal layer portion 504 of the submount and are connected in parallel. Seven LED chips 712 are fastened to metal layer portion 506 of the submount and are also connected in parallel. As before, the anodes of the LED chips are in contact with portions of the metal layer of submount 500.

Still referring to FIG. 14, the cathodes of all of the LED chips are connected by wire bonds to metal layer portions of submount. Wire bonds 714 are connected to interconnection rail 514 of the central bus of submount 500, and wire bonds 716 are connected to metal layer portion 408 of the submount. Wire bonds 718 are connected to extension rail 512 of the central bus of submount 500, and wire bonds 720 are connected to metal layer portion 510 of the submount 500. LED device 700 includes an electrostatic discharge (ESD) protection chip 730, fastened to metal layer portion 510 with a wire bond connected to metal layer portion 504. As before, metal layer portion 504 is connected to the positive terminal of a power source and metal layer portion 510 is connected to the negative terminal. The wire bonds connected between the LED chips within each group of seven LED chips in LED device 700 and the submount are again arranged so that all the wire bonds in a group are disposed on the outside of the group of seven LED chips, allowing the LED chips in a group to be placed close together. The LED chips within a group are connected in parallel while the groups of chips are connected in series.

The LED chips 710 and 712 and ESD chip 730 of LED device 700 of FIG. 14 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 14 for clarity of illustration. Again, an optical element, for example, a lens, may affect light by bending and/or concentrating light rays, by color mixing, or by a combination of these effects. A phosphor could also be used to provide wavelength conversion. A lens or other optical element for use with an LED device of any embodiment of the invention may be made of glass or plastic, may be molded in place or elsewhere, or otherwise formed or attached to the device as desired. In example embodiments, clearance is maintained between the edge of any of the plurality of interconnected LED chips and the edge of the lens as previously described.

As before, the LED chips in the device of FIG. 14 may be selected from various light color bins to provide a combined light output with a high CRI. In some example embodiments, the lens for an LED device such as LED device 700 of FIG. 14 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, of various sizes, materials, and types may be used, as described with respect to FIG. 13. An LED device like that shown in FIG. 14 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved.

FIG. 15 is a top-down view of an LED device 800 according to some example embodiments of the invention. LED device 800 makes use of submount 500 as previously described, and includes sixteen LED chips arranged in two groups. Eight LED chips 810 are fastened to metal layer portion 504 of the submount. Eight LED chips 812 are fastened to metal layer portion 506 of the submount. As before, the anodes of the LED chips are in contact with portions of the metal layer of submount 500. The cathodes of all of the LED chips in device 800 are connected by wire bonds to metal layer portions of the submount. Wire bonds 814 are connected to interconnection rail 514 of the central bus of submount 500, and wire bonds 816 are connected to metal layer portion 408 of the submount. Wire bonds 818 are connected to extension rail 512 of the central bus of submount 500, and wire bonds 820 are connected to metal layer portion 510 of the submount 500.

Still referring to FIG. 15, device 800 includes an electrostatic discharge (ESD) protection chip 830, fastened to metal layer portion 510 and connected by a wire bond to metal layer portion 504. As before, metal layer portion 504 is connected to the positive terminal of a power source and metal layer portion 510 is connected to the negative terminal. The wire bonds connected between the LED chips within each group of eight LED chips in LED device 800 and the submount are again arranged so that all the wire bonds in a group are disposed on the outside of the group of eight LED chips, allowing the LED chips in a group to be placed close together. The LED chips within a group are connected in parallel while the groups are connected in series.

The LED chips and ESD chip of LED device 800 of FIG. 15 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 15 for clarity of illustration. Again, an optical element, for example, a lens, may affect light by bending and/or concentrating light rays, by color mixing, or by a combination of these effects. A phosphor could also be used to provide wavelength conversion. A lens or other optical element for use with an LED device of any embodiment of the invention may be made of glass or plastic, may be molded in place or elsewhere, or otherwise formed or attached to the device as desired. Clearance is maintained between the edge of any of the plurality of interconnected LED chips and the edge of the lens as previously described.

As before, the LED chips in the device of FIG. 15 may be selected from various light color bins to provide a combined light output with a high CRI. In some example embodiments, the lens for an LED device such as LED device 800 of FIG. 15 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, of various sizes, materials, and types may be used, as described with respect to FIG. 13. An LED device like that shown in FIG. 15 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved.

Figure 16:
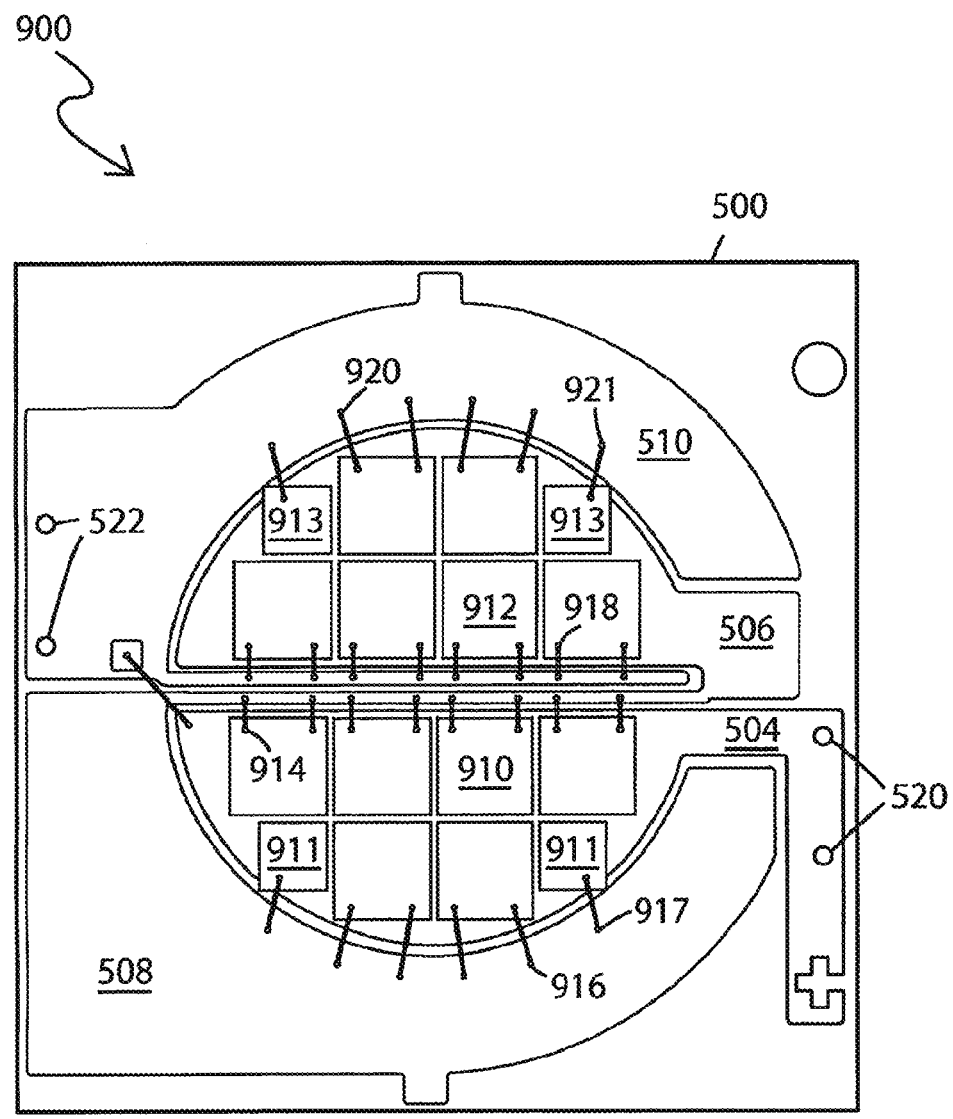

As previously mentioned, an embodiment of the invention does not need to use LED chips of equal size. FIG. 16 is a top-down view of an LED device 900 in which different sizes of LED chips are used. LED device 900 makes use of submount 500 as described in FIG. 11. LED device 900 includes sixteen LED chips, including chips of two different sizes, arranged in two groups. Six LED chips 910 of one size and two LED chips 911 of a smaller size are fastened to metal layer portion 504 of the submount and are connected in parallel. The anodes of the LED chips 910 and 911 are on the bottoms of the chips and are in contact with metal layer portion 504, which is in turn connected to the positive terminal of a power source supplying current to the device via connection points 520. Six LED chips 912 of one size and two LED chips 913 of a smaller size are fastened to metal layer portion 506 of the submount and are also connected in parallel. The anodes of the LED chips 912 and 913 are on the bottoms of the chips and are in contact with metal layer portion 506.

Still referring to FIG. 16, the cathodes of all of the LED chips are connected by wire bonds to metal layer portions of submount 500 as follows. Wire bonds 914 are connected from the cathodes of some of LED chips 910 to interconnection rail 514 of the central bus of submount 500, and wire bonds 916 are connected from the rest of LED chips 910 to metal layer portion 508 of the submount. Wire bonds 917 are connected from the cathodes of smaller LED chips 911 to metal layer portion 408 of the submount. Wire bonds 918 from the cathodes of some of LED chips 912 are connected to extension rail 512 of the central bus of submount 500, and wire bonds 920 are connected from the cathodes of the remainder of LED chips 912 to metal layer portion 510 of the submount 500. Wire bonds 921 are connected from the cathodes of smaller LED chips 913 to metal layer portion 508 of the submount.

Staying with FIG. 16, LED device 900 includes an electrostatic discharge (ESD) protection chip 930 connected as previously described. Metal layer portion 504 is connected to the positive terminal of a power source supplying current to the LED device. Metal layer portion 510 is connected to the negative terminal of a power source supplying current to the LED device. The wire bonds connected between the LED chips within each group of eight, mixed size LED chips in LED device 900 and the submount are arranged so that all the wire bonds in a group are disposed on the outside of the group of LED chips, allowing the LED chips in a group to be placed close together. Also, the patterning of the metal layer portions of the submount together with the arrangement of wire bonds interconnects the LED chips within a group in parallel while the groups of chips are connected in series.

As with the other embodiments, the LED chips and ESD chip of LED device 900 of FIG. 16 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 16 for clarity of illustration. Again, an optical element, for example, a lens, may affect light by bending and/or concentrating light rays, by color mixing, or by a combination of these effects. A phosphor could also be used to provide wavelength conversion. A lens or other optical element for use with an LED device of any embodiment of the invention may be made of glass or plastic, may be molded in place or elsewhere, or otherwise formed or attached to the device as desired. In example embodiments, an appropriate clearance is again maintained between the edge of any of the plurality of interconnected LED chips and the edge of the lens.

As before, the LED chips in the device of FIG. 16 may be selected from various light color bins to provide a combined light output with a high CRI. In some example embodiments, the lens for an LED device such as LED device 900 of FIG. 16 may be less than 12 mm in diameter. In some embodiments, the lens may be less than 10 mm in diameter, less than 9 mm in diameter, or less than 8 mm in diameter. In some embodiments the lens may be about 9.1 mm in diameter. Various numbers of chips of various sizes may be combined in different ways to form a device according to embodiments of the invention. Chips of two different size, three different sizes or four different sizes may be used. Larger LED chips of about 1000 microns in size, meaning the chips are about 1000 microns wide on a side, can be used. However, of various sizes may be used. The larger chips may be about or less than 2000 microns in size, about or less than 1000 microns in size, about or less than 700 microns in size or about or less than 500 microns in size. The smaller chips may be 1000 microns, 700 microns, 500 microns in size, or smaller.

The ability to use multiple LED chips of different sizes allows a designer to "tune" the multi-chip LED device for the desired combination of voltage, current density and light output. Smaller chips can also be used to fill in spaces between or around larger chips to achieve greater chip density. LED chips of different sizes have different current densities for the same drive current, as larger chips have a lower forward voltage for the same drive current than smaller chips due to current density. LED chips of different sizes can be mixed together in either embodiments of the invention using one group of chips, such as the embodiment described with respect to FIG. 2, or in embodiments with two groups of chips where parallel groups are connected in series, such as those described with respect to FIGS. 13-16. An LED device like that shown in FIG. 16 may have an efficiency of at least, 80, 85, or 90 lumens/Watt (lm/W) and a CRI of at least 80. The LED device may have an efficiency of about 95 lm/W and a CRI of at least 82. The efficiency of such an LED device with a warm white color, often desired for incandescent replacement lighting, may be as much as about 100 lm/W. However, if the device is binned for a cool white color, an efficiency of as much as about 150 lm/W can be achieved. The design of the LED device of FIG. 16 can again be adapted so that various types of LED chips could be used, such as direct-bond chips, flip-chips, and chips with substrates made of sapphire, silicon carbide, silicon or other materials.

FIG. 17 is a top-down view of another submount 1000, which can be used for various LED devices according to example embodiments of the invention. Submount 1000 of FIG. 17 again includes a rigid base 1002 that, as an example, can be made of plastic, or as a further example can be made of a ceramic material such as alumina or aluminum nitride. Submount 1000 includes a patterned metal layer shaped to provide connectivity to LED chips fixed to the submount. This patterned metal layer again includes semicircular areas of metal to which vertical LED chips can be bonded. Metal layer portion 1004 is for connection to the anodes of one group of LED chips fixed to the submount, and metal layer portion 1006 is for connection to the anodes of another group of LED chips. Metal layer portion 1008 is for connection to some of the cathodes of LED chips in the first group of LED chips, and metal layer portion 1010 is for connection to some of the cathodes in the other group of LED chips. Metal layer portion 1010 is connected to protruding rail 1012 and metal layer portions 1004 and 1006 are both adjacent to this rail, and near each other. Like the submount shown in FIG. 12, rail 1012 and the adjacent portions of the metal layer form a centrally located connection bus, or more simply, a central bus to which wire bonds from some of the cathodes of the LED chips are connected.

The metal layer can be initially deposited on the base and then etched to form the desired pattern, can be formed and fixed to the base with adhesive, molded into a base, or produced in any other suitable fashion. The metal layer can include various holes and notches for alignment during manufacturing, visible identifications and the like, as well as connection points, such as connection points 1020 for connecting wires from the positive side of the power source to the LED device and connection points 1022 for connecting wires from the negative side of the power source to the LED device. Connection points may be formed of additional metal or solder deposited on the metal layer.

FIG. 18 is a top-down view of an LED device 1100 according to some example embodiments of the invention. LED device 1100 makes use of submount 1000 as described in FIG. 17. LED device 1100 includes twelve LED chips arranged in two groups. Six LED chips 1120 are fastened to metal layer portion 1006 of the submount and are connected in parallel. The anodes are on the bottom of the LED chips 1120 and are in contact with metal layer portion 1006. Six LED chips 1121 are fastened to metal layer portion 1004 of the submount and are also connected in parallel. The anodes of the LED chips 1121 are in contact with metal layer portion 1004.

Still referring to FIG. 18, the cathodes of all of the LED chips are connected by wire bonds to metal layer portions of submount 1000. Wire bonds from the cathodes of LED chips 1120 are connected to metal layer portions of the submount. More specifically, wire bonds 1122 are connected to interconnection rail 1012 of the central bus of submount 1000, and wire bonds 1123 are connected to metal layer portion 1010 of the submount. Wire bonds from the cathodes of LED chips 1121 are also connected to metal layer portions of the submount. More specifically, wire bonds 1125 are connected to a nearby part of metal layer portion 1006 of submount 1000, and wire bonds 1126 are connected to metal layer portion 1008 of the submount 1000.

Staying with FIG. 18, LED device 1100 includes an electrostatic discharge (ESD) protection chip 1130, fastened to metal layer portion 1010 and connected with a wire bond to metal layer portion 1004. Metal layer portion 1004 is connected to the positive terminal of a power source supplying current to the LED device via connection points 1020. Metal layer portion 1010 is connected to the negative terminal of a power source supplying current to the LED device via connection points 1022. The wire bonds connected between the LED chips within each group of six LED chips in LED device 1100 and the submount are arranged so that all the wire bonds in a group are disposed on the outside of the group of six LED chips, allowing the LED chips in a group to be placed close together and this density of the LED chips in a group allows LED device 1100 to be relatively small but still have a relatively high efficiency and output. Also, the patterning of the metal layer portions of the submount together with the arrangement of wire bonds interconnects the LED chips within a group in parallel while the groups themselves are connected in series. Other series and parallel combinations can be implemented.

The LED chips and ESD chip of LED device 1100 of FIG. 18 can be fastened to the submount with conductive adhesive, solder, a welding process, or in any of various other ways. As before, the device is completed with an optical element placed on top of the device to affect light from the LED chips. Both the optical element and the distortion it would introduce when the device is viewed are omitted in FIG. 18 for clarity of illustration, but an example lens is discussed later with respect to FIG. 21. Again, an optical element, for example, a lens, may affect light by bending and/or concentrating light rays, by color mixing, or by a combination of these effects. A phosphor could also be used to provide wavelength conversion. In example embodiments, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example, if the maximum width of the LED chips is 5.6 mm, the lens clearance is about 1.7 mm, or about 0.303 the maximum width of the LED chips.

As before, the LED chips in the device of FIG. 18 may be selected from various light color bins to provide a combined light output with a high CRI. In some example embodiments, the lens for an LED device such as LED device 1100 of FIG. 18 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, chips of various sizes may be used. The chips may be about or less than 2000 microns in size, about or less than 1000 microns in size, about or less than 700 microns in size or about or less than 500 microns in size. An LED device like that shown in FIG. 18 may have an efficiency of at least, 80, 85, or 90 lumens/Watt (lm/W) and a CRI of at least 80. The LED device may have an efficiency of about 95 lm/W and a CRI of at least 82. The design of the LED device of FIG. 18 can be adapted so that various types of LED chips could be used, such as direct-bond chips, flip-chips, and chips with substrates made of sapphire, silicon carbide, silicon or other materials. The efficiency of such an LED device with a warm white color, often desired for incandescent replacement lighting, may be as much as about 100 lm/W. However, if the device is binned for a cool white color, an efficiency of as much as about 150 lm/W can be achieved.

FIG. 19 is a top-down view of an LED device 1200 according to some example embodiments of the invention. LED device 1200 again makes use of submount 1000 as described in FIG. 17. LED device 1200, however, includes two different kinds of LED chips. LED chips 1220 are positioned and connected in the same fashion as the LED chips 1120 in FIG. 18 that were fastened to metal rail 1012. LED chips 1221 are fastened to metal layer portion 1004 of the submount. Device 1200 however, also includes sideview LED chips 1240, each of which has wire bonds connected to the top for both the anode and the cathode. LED chips 1240 are also rectangular in shape instead of square in shape. Wire bonds 1242 connect the anodes and wire bonds 1244 connect the cathodes to the appropriate metal layer portion. Thus, high density LED multi-chip devices according to embodiment of the invention can include different types and shapes of LEDs. Any of various types can be used alone, or different types, sizes and shapes of LEDs can be combined.

Staying with FIG. 19, LED device 1200 includes an electrostatic discharge (ESD) protection chip 1230, fastened to metal layer portion 1010 and connected with a wire bond to metal layer portion 1004. Metal layer portion 1004 is connected to the positive terminal of a power source supplying current to the LED device via connection points 1020. Metal layer portion 1010 is connected to the negative terminal of a power source supplying current to the LED device via connection points 1022. The wire bonds connected between the LED chips within each group of six mixed-type LED chips in LED device 1200 and the submount are again arranged so that all the wire bonds in a group are disposed on the outside of the group of six LED chips, allowing the LED chips in a group to be placed close together and this density of the LED chips in a group allows LED device 1200 to be relatively small but still have a relatively high efficiency and output. Also, the patterning of the metal layer portions of the submount together with the arrangement of wire bonds interconnects the LED chips within a group in parallel while the groups themselves are connected in series. Other series and/or parallel combinations of LEDs are possible with all of the submounts shown in the various embodiments described herein.

As before, device 1200 of FIG. 19 is completed with an optical element placed on top of the device to affect light from the LED chips. Both the optical element and the distortion it would introduce when the device is viewed are omitted in FIG. 19 for clarity of illustration, but an example lens is discussed later with respect to FIG. 21. In an embodiment with mixed chip sizes and shapes, a clearance is again maintained between the edge of any of the plurality of interconnected LED chips and the edge of the lens. In some embodiments, the clearance is approximately 0.2 to 0.8 the maximum width across the LED chips. The clearance can also be from 0.3 to 0.65 the width of the LED chips. In a more specific example, if the maximum width of the LED chips is 5.6 mm, the lens clearance is about 1.7 mm, or about 0.303 the maximum width of the LED chips.

As before, the LED chips in the device of FIG. 19 may be selected from various light color bins to provide a combined light output with a high CRI. In some example embodiments, the lens for an LED device such as LED device 1200 of FIG. 19 may be less than 12 mm in diameter. In some embodiments, the lens may be less than 10 mm in diameter, less than 9 mm in diameter, or less than 8 mm in diameter. In some embodiments the lens may be about 9.1 mm in diameter and may use identical LED chips of about 1000 microns in size, meaning the chips are about 1000 microns wide on a side. However, chips of various sizes may be used. The chips may be about or less than 2000 microns in size, about or less than 1000 microns in size, about or less than 700 microns in size or about or less than 500 microns in size. An LED device like that shown in FIG. 19 may have an efficiency of at least, 80, 85, or 90 lumens/Watt (lm/W) and a CRI of at least 80. The LED device may have an efficiency of about 95 lm/W and a CRI of at least 82. Again, the efficiency of such an LED device with a warm white color, often desired for incandescent replacement lighting, may be as much as about 100 lm/W. However, if the device is binned for a cool white color, an efficiency of as much as about 150 lm/W can be achieved.

FIG. 20 is a generalized, electronic schematic diagram of the circuit of the LED devices from FIGS. 13-19. Circuit 1300 includes multiple LEDs 1302 connected in parallel to form a first group of LEDs connected in parallel. Multiple LEDs 1303 are connected in parallel to form a second group of LEDs connected in parallel. The two groups of parallel LEDs are in turn connected in series. Current to illuminate the LEDs is supplied by power source 1305. ESD protection device 1306 is connected in parallel across the entire LED circuit spanning both groups of LEDs.

FIG. 21 is a perspective view of LED device 1100 previously shown and described with respect to FIG. 18. In FIG. 21, the optical element, lens 1150 is visible over the two groups of six LED chips and submount 1000. The distortion introduced by the lens can also be seen. In the view of FIG. 21, device 1100 is positioned so that the plus sign in the metal layer is in the top left corner. As previously mentioned a lens for use with an LED device of an embodiment of the invention may be made of glass or plastic, may be molded in place or elsewhere, or otherwise formed or attached to the device as desired. For example, the lens may be molded in place from silicone. FIG. 21 illustrates a lens used with the embodiment of the LED device previously shown in FIG. 18, however, essentially the same type and appearance of lens can be used with any of the embodiments described herein, with appropriate adjustment in the size of the lens for the number of LED chips and size of the substrate used.

FIG. 22 illustrates the how the clearance between the LED chips and the edge of the lens is determined for embodiments of the invention. The view of FIG. 22 is purely schematic. In this example, fourteen identical LED chips are represented by squares 1502. The outer edge of the lens is represented by circle 1504. Circle 1506 circumscribes the LED chips at their widest point. Area 1508 is the clearance area, with the size of the clearance defined by length 1510. As previously described, this size, in example embodiments, can be approximately 0.2 to 0.8 the maximum width across the LED chips. The clearance can also be from 0.3 to 0.65 the width of the LED chips.

High density multi-chip devices as described herein, especially as exemplified by the embodiments shown in FIGS. 12-22 can be made with many types of LED chips. Vertical chips have been used extensively in these embodiments, but flip-chip and sideview chips can also be used, and sideview style chips have also been shown in some of these specific embodiments. Chips with low reabsorption, especially for blue light, can assist in improving light output. Square submounts have been shown, but submounts of various shapes and sizes can be used. Submounts can be ceramic as in previous examples, metal, or plastic. A plastic submount may have a metal slug to aid in heat sinking Various semiconductor materials can be used for the LEDs, including silicon carbide and sapphire. The layouts provide for high-density and very efficient light output in part by placement of wire bonds needed to interconnect the LED chips. The specific submount metal pattern designs minimize light absorption by the submount, and also help increase light output.

The characteristics described above can enable a high-density device light that described to be used in a solid-state replacement for a bright halogen bulb such as the now popular MR16 halogen multi-reflector bulb. In example embodiments, the device size is about 10 mm on a side. It is possible, by the use of smaller LED chips, or fewer, larger LED chips to still achieve very high efficiency in a small package, for example, a package less than 5 mm on a side or less than 3.5 mm on a side. Four 1000-micron LED chips could be replaced with one 2000-micron LED chip. A device could also be scaled to exactly the maximum size that would fit in an LED bulb of a form factor appropriate for a specific incandescent or halogen bulb, such as the previously mentioned MR16 bulb.

FIG. 23a is a perspective drawing of an embodiment of an inventive light-emitting device 301 including an array 304 of eight LEDs 305. Array 304 is secured to a submount 303 which includes an aluminum nitride ceramic layer 309. An asymmetric lens 307 is overmolded on submount 303, including over array 304. Further details of device 301 are better illustrated in the figures which follow.

FIG. 23b is a perspective drawing of an alternative embodiment of the inventive light-emitting device, device 301a. Device 301a includes LED array 304a which has forty-eight LEDs 305a and 305b. LEDs 305a and 305b are two dissimilar colored LEDs illustrating that color mixing can be achieved within array 304a. The structure of device 301a is otherwise similar to device 301.

Light from device 301 is directed to a preferential side. In FIG. 23a (and FIG. 23b for devices 301a), light from array 304 (or 304a) is directed into the page and to the right. Such preferential-side light directing is best illustrated in FIGS. 23c-23e. Device 301 includes an asymmetric lens 307. In FIG. 23c, direction of preferential-side illumination is toward the top of the figure; in FIG. 23e, direction of preferential-side illumination is to the right of the figure.

Preferential-side illumination is also achieved by the relative position of array 304 and lens 307. FIG. 23c is a front (top) view of device 301. FIG. 23c shows array 304 centerline 325 (emitter axis) and lens centerline 323. Lens centerline 323 is offset from lens centerline 325 by offset distance 327. Offset distance 327 may be on the order of 0.24 mm for array dimensions 2.08 mm by 4.23 mm within submount dimensions 8.22 mm by 11.25 mm. Numerous other dimensional sets are possible.

FIGS. 23d and 23e are side and end views of device 301, further illustrating asymmetric lens 307.

FIG. 24a is a front (top) view of submount 303 of device 301 of FIG. 23a and device 301a of FIG. 23b. Best seen in FIG. 24a is the contact pad configuration of submount 303. Submount 303 includes three contact pads: positive contact pad 311p; intermediate contact pad 311i; and negative contact pad 311n. Each such contact pad is deposited onto ceramic layer 309 by a metallization process. (See discussion of FIG. 26 for further details.) The geometric configuration of the three contact pads 311p, 311i and 311n is such that array 304 can be conveniently laid out in a rectangular pattern such as shown in FIGS. 23a and 23b. Numerous other patterns are possible as are numerous other geometric configurations of the contact pads. Such other configurations and patterns are not limited by the embodiments shown.

FIG. 24b is an edge view of submount 303, illustrating ceramic layer 309 on which contact pads 311 (311p, 311i and 311n) are deposited. FIG. 24c is a back (bottom) view of submount 303 illustrating mounting pads 321, 321p and 321n, also deposited onto ceramic layer 309 by a metallization process. Mounting pads 321p and 321n are electrically-connected to contact pad 311p and 311n, respectively, with vias 321v which pass through ceramic layer 309 with metallization, thereby enabling mounting pads 321p and 321n to serve as electrical connections to a printed circuit board or other structure for device 301. Mounting pad 321, electrically-isolated from mounting pads 321p and 321n, serve to provide good thermal conductivity for submount 303.

In FIGS. 24a and 24c, three vias 321v are shown for each polarity, connected to mounting pad 321p and 321n, respectively.

FIG. 25 is a detailed view of the upper right corner of submount 303 of device 301. That is, FIG. 25 illustrates contact pad metallization layers 315 (titanium layer), 317 (copper layer) and 319 (silver layer) on a portion of aluminum nitride ceramic layer 309. Note that all of these layers are not shown in their proper relative thicknesses. Preferred approximate layer thicknesses may be as follows: aluminum ceramic layer 309—0.50 mm; titanium layer 315—0.06 microns; copper layer 317—50 microns; and silver layer 319—3.5 microns.

FIG. 26 is front view of submount 303 of device 301. FIG. 26 illustrates contact pads 311n, 311p and 311i, deposited onto ceramic layer 309 via metallization. LED array 304 includes eight LEDS 305, four LEDs 305 bonded onto positive contact pad 311p and four LEDs 305 bonded onto intermediate contact pad 311i. In this embodiment, LEDs 305 are bonded onto the corresponding contact pads with the cathode side (n-type material) contacting the contact pads. The opposite sides of LEDs 305 are the anode sides (p-type material), and these are wirebonded to other contact pads to complete the electrical circuit of device 301.

FIG. 26 illustrates the wirebonding connections as follows: the anode sides of each of the four LEDs 305 bonded to positive contact pad 311p are wirebonded to intermediate contact pad 311i with two wirebond connections 313 and the anode sides of each of the four LEDs 305 bonded to intermediate contact pad 311*i* are wirebonded to negative contact pad 311*n* with two wirebond connections 313. The second wirebond connection on each LED 305 provides electrical redundancy for each LED 305.

FIG. 26 also shows gaps 310 between contact pads which provide electrical isolation therebetween. In this example, the LEDs on positive contact pad 311*p* (first subset) are in parallel with each other, and the LEDs on intermediate contact pad 311*i* (second subset) are in parallel with each other. The two subsets of parallel LEDs are in series with one another.

FIG. 27 is front view of submount 303 of device 302. FIG. 27 illustrates contact pads 311*n*, 311*p*, 311*i*(1) and 311*i*(2), deposited onto ceramic layer 309 via metallization. LED array 304 includes twelve LEDS 305, four LEDs bonded onto positive contact pad 311*p*, four LEDs bonded onto first intermediate contact pad 31141), and four LEDs bonded onto second intermediate contact pad 311*i*(2). In this embodiment, LEDs 305 are bonded onto the corresponding contact pads with the cathode side (n-type material) contacting the contact pads. The opposite sides of LEDs 305 are the anode sides (p-type material), and these are wirebonded to other contact pads to complete the electrical circuit of device 302.

FIG. 27 illustrates the wirebonding connections as follows: The anode sides of each of the four LEDs bonded to positive contact pad 311*p* are wirebonded to first intermediate contact pad 311*i*(1) with two wirebond connections 313, the anode sides of each of the four LEDs bonded to first intermediate contact pad 31*i*(1) are wirebonded to second intermediate contact pad 311*i*(2) with two wirebond connections 313, and the anode sides of each of the four LEDs bonded to second intermediate contact pad 311*i*(2) are wirebonded to negative contact pad 311*n* with two wirebond connections 313. The second wirebond connection on each LED 305 provides electrical redundancy for each LED.

FIG. 27 also shows gaps 310 between contact pads which provide electrical isolation therebetween. In this example, the LEDs on positive contact pad 311*p* (first subset) are in parallel with each other, the LEDs on intermediate contact pad 311*i*(1) (second subset) are in parallel with each other, and the LEDs on intermediate contact contact pad 311*i*(2) (third subset) are in parallel with each other. The three subsets of parallel LEDs are in series with one another.

FIG. 28 is simple circuit diagram illustrating the electrical connectivity of LEDs 305 within device 302. In essence, the connectivity is three sets of four parallel LEDs with each of the three sets connected in series with each other. Positive contact 311*p* is connected to the positive terminal of a DC driver circuit (not shown) and negative contact pad 311*n* is connected to the negative terminal of such driver circuit. First intermediate contact pads 311*i*(1) and second intermediate contact pad 311*i*(2) form common connection points for the LEDs as indicated in FIG. 28. (Device 301*a* of FIG. 23*b*, with its forty-eight LEDs 305 in array 304*a*, electrically is arranged with two sets of 24 parallel LEDs 305, the two sets connected in series with each other.)

Other serial/parallel configurations are possible.

Regarding the LED packages, the present invention has been described in detail with reference to certain embodiments and configurations thereof, but other versions are possible. Therefore, the spirit and scope of the invention should not be limited to the versions described above.

While the principles of this invention have been described in connection with specific embodiments, it should be understood clearly that these descriptions are made only by way of example and are not intended to limit the scope of the invention.

The invention claimed is:

1. A light-emitting device comprising:
   a submount having front and back sides and including a ceramic layer;
   an array of light emitting diodes (LEDs) on the front side; and
   an asymmetric lens overmolded on the submount and covering the LED array;
   wherein:
   the submount comprises at least three contact pads, including a positive contact pad, a negative contact pad, and at least one intermediate contact pad;
   a first subset of the LEDs is secured with respect to one of the positive and negative contact pads; and
   a second subset of the LEDs is secured with respect to one of the at least one intermediate contact pads, the first and second subsets being mutually-exclusive and having the same number of LEDs.

2. The device of claim 1 wherein the ceramic material comprises aluminum nitride.

3. The device of claim 1 wherein the contact pads each comprise metallization with copper.

4. The device of claim 3 wherein the copper metallization has a thickness of about 40-60 microns.

5. The device of claim 4 wherein the copper metallization has a thickness of about 50 microns.

6. The device of claim 3 wherein the contact pads each has an outer layer of silver.

7. The device of claim 6 wherein the outer layer has a thickness of about 0.2-0.5 microns.

8. The device of claim 6 wherein the contact pads each has an inner layer of titanium between the copper and the ceramic.

9. The device of claim 8 wherein the inner layer has a thickness of about 0.6 microns.

10. The device of claim 1 wherein the array includes eight LEDs.

11. The device of claim 1 wherein the array includes forty-eight LEDs.

12. The device of claim 1 wherein there is one intermediate contact pad and each LED of the array is in one of the two subsets.

13. The device of claim 12 wherein the array includes eight LEDs.

14. The device of claim 12 wherein the array includes forty-eight LEDs.

15. The device of claim 1 wherein each LED has a pad side and an opposite side and each LED is electrically connected to an adjacent contact pad with at least one wirebonded conductor.

16. The device of claim 15 wherein each LED is electrically connected with two wirebonded conductors for electrical redundancy.

17. The device of claim 1 configured to refract LED-emitted light toward a preferential direction.

18. The device of claim 17 wherein:
   the LED array defines an emitter axis; and
   the lens has an outer surface and a centerline which is offset from the emitter axis toward the preferential direction.

19. The device of claim 17 wherein the lens is shaped for refraction of LED-emitted light toward the preferential direction.

20. The device of claim 19 wherein:
   the LED array defines an emitter axis; and
   the lens has an outer surface and a centerline which is offset from the emitter axis toward the preferential direction.

21. The device of claim 1 further including at least two electrically-conductive mount pads on the back side for electrical connection of the device.

22. The device of claim 21 wherein the submount has electrically-conductive vias providing electrical connection between the mount pads and the contact pads.

23. The device of claim 1 wherein the array defines an LED-populated area on the submount and the LED-populated area has an aspect ratio greater than 1.

24. The LED light source of claim 23 wherein the aspect ratio is at least about 2.

25. The LED light source of claim 24 wherein the aspect ratio is at least about 3.

26. The LED light source of claim 23 wherein the LED-populated area is rectangular.

27. The LED light source of claim 1 wherein the array includes at least eight LEDs positioned in two rows of four LEDs in each row.

28. The LED light source of claim 1 wherein the array includes forty-eight LEDs positioned in four rows of twelve LEDs in each row.

29. A light-emitting device comprising:
a submount having front and back sides, an electrically-insulating layer, at least three front-side electrically-conductive contact pads including a positive contact pad, a negative contact pad, and at least one intermediate contact pad; and
an array of light emitting diodes (LEDs) on the front side, the array including a first subset of the LEDs secured with respect to one of the positive and negative contact pads, and a second subset of the LEDs secured with respect to one of the at least one intermediate contact pads, the first and second subsets being mutually-exclusive and having the same number of LEDs.

30. The device of claim 29 wherein the array includes eight LEDs.

31. The device of claim 29 wherein the array includes forty-eight LEDs.

32. The device of claim 29 wherein there is one intermediate contact pad and each LED of the array is in one of the two subsets.

33. The device of claim 32 wherein the array includes eight LEDs.

34. The device of claim 32 wherein the array includes forty-eight LEDs.

35. The device of claim 29 wherein each LED has a pad side and an opposite side and each LED is electrically connected to an adjacent contact pad with at least one wirebonded conductor.

36. The device of claim 35 wherein each LED is electrically connected with two wirebonded conductors for electrical redundancy.

37. The device of claim 29 wherein there are two intermediate contact pads and further including a third mutually-exclusive subset of LEDs of the array, and each of the LEDs is in one of the three subsets.

38. The device of claim 37 wherein the array defines an LED-populated area on the submount and the LED-populated area is rectangular.

39. The device of claim 29 wherein:
one of the positive and negative contact pads is an innermost pad and is adjacent to a first edge of the submount;
a first intermediate contact pad substantially surrounds the innermost pad on three sides thereof other than the first-edge-adjacent side thereof; and
the other of the positive and negative contact pads substantially surrounds the first intermediate contact pad on three sides thereof other than the first-edge-adjacent side thereof.

40. The device of claim 39 wherein the array defines an LED-populated area on the submount and the LED-populated area is rectangular having a smaller dimension adjacent to the first edge of the submount.

41. The device of claim 39 wherein the innermost pad is the positive contact pad.

42. The device of claim 41 wherein:
the array defines an LED-populated area on the submount and the LED-populated area is rectangular having a smaller dimension adjacent to the first edge of the submount;
the first subset of the LEDs is on the innermost pad; and
the second subset of the LEDs is on the intermediate contact pad.

43. The device of claim 39 further including:
a second intermediate contact pad which substantially surrounds the first intermediate contact pad on three sides thereof other than the first-edge-adjacent side thereof; and
a third subset of the LEDs, the first, second and third subsets being mutually-exclusive and having the same number of LEDs.

44. The device of claim 43 wherein the innermost pad is the positive contact pad.

45. The device of claim 44 wherein:
the array defines an LED-populated area on the submount and the LED-populated area is rectangular having a smaller dimension adjacent to the first edge of the submount;
the first subset of the LEDs is on the innermost pad;
the second subset of the LEDs is on the first intermediate contact pad; and
the third subset of the LEDs is on the second intermediate contact pad.

46. The device of claim 29 wherein:
one of the positive and negative contact pads is an innermost pad;
a first intermediate contact pad substantially surrounds the innermost pad on at least three sides thereof; and
the other of the positive and negative contact pads substantially surrounds the first intermediate contact pad on at least three sides thereof.

47. The device of claim 46 wherein the array defines an LED-populated area on the submount having an aspect ratio of greater than 1.

48. The device of claim 46 wherein the LED-populated area is rectangular.

49. The device of claim 47 wherein the array defines an LED-populated area on the submount having an aspect ratio of at least about 2.

50. The device of claim 49 wherein the array defines an LED-populated area on the submount having an aspect ratio of at least about 3.

51. A light-emitting device comprising:
a submount having an electrically-insulating layer, a front side, and at least three front-side electrically-conductive contact pads, including a positive contact pad, a negative contact pad, and at least one intermediate contact pad; and
an array of light emitting diodes (LEDs) on the front side, the array defining an LED-populated area having an aspect ratio greater than 1, the array including first and second mutually-exclusive subsets of the LEDs, the LEDs of each of the subsets being electrically in parallel with each other and the subsets being electrically in series;

wherein the LEDs of the first subset are on the positive contact pad and the LEDs of the second subset are on the intermediate contact pad.

52. A light-emitting device comprising:
a submount; and
a rectangular light emitting diode (LED) array defining an LED-populated area having an aspect ratio greater than 1, the LED array including first and second subsets of the LEDs, the LEDs within each of the subsets being electrically in parallel with each other and the first and second subsets being electrically in series with each other.

53. The light-emitting device of claim 52 further comprising at least three electrically-conductive contact pads, including a positive contact pad, a negative contact pad, and at least one intermediate contact pad.

54. The light-emitting device of claim 53 wherein the first subset of the LEDs is secured with respect to one of the positive and negative contact pads, and the second subset of the LEDs is secured with respect to one of the at least one intermediate contact pads.

55. The light-emitting device of claim 54 further comprising a lens on the submount and covering the LED array.

56. The light-emitting device of claim 55 wherein the lens is overmolded on the submount.

57. The light-emitting device of claim 56 wherein the lens is asymmetric.

58. The light-emitting device of claim 52 further comprising a lens on the submount and covering the LED array.

59. The light-emitting device of claim 58 wherein the lens is overmolded on the submount.

60. The light-emitting device of claim 59 wherein the lens is asymmetric.

61. A submount comprising first, second and third contact pads, the second contact pad substantially surrounding the first contact pad on at least three sides, and the third contact pad substantially surrounding the second contact pad on at least three sides.

62. The submount of claim 61 wherein the first contact pad is a positive contact pad, the second contact pad is an intermediate contact pad, and the third contact pad is a negative contact pad.

63. A light-emitting device comprising:
a submount including first, second and third contact pads, the second contact pad substantially surrounding the first contact pad on at least three sides, and the third contact pad substantially surrounding the second contact pad on at least three sides; and
a light emitting diode (LED) array on the contact pads.

64. The light-emitting device of claim 63 wherein the first contact pad is a positive contact pad, the second contact pad is an intermediate contact pad, and the third contact pad is a negative contact pad.

* * * * *